(12) United States Patent
Zuo et al.

(10) Patent No.: US 9,331,666 B2
(45) Date of Patent: May 3, 2016

(54) COMPOSITE DILATION MODE RESONATORS

(71) Applicant: QUALCOMM MEMS Technologies, Inc., San Diego, CA (US)

(72) Inventors: Chengjie Zuo, Santee, CA (US);
Jonghae Kim, San Diego, CA (US);
Changhan Hobie Yun, San Diego, CA (US); Sang-June Park, San Diego, CA (US); Philip Jason Stephanou, Mountain View, CA (US); Chi Shun Lo, San Diego, CA (US); Robert Paul Mikulka, Oceanside, CA (US); Mario Francisco Velez, San Diego, CA (US); Ravindra V. Shenoy, Dublin, CA (US); Matthew Michael Nowak, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 657 days.

(21) Appl. No.: 13/657,653

(22) Filed: Oct. 22, 2012

(65) Prior Publication Data

US 2014/0111064 A1 Apr. 24, 2014

(51) Int. Cl.
*H01L 41/047* (2006.01)
*H03H 9/02* (2006.01)
*H03H 9/205* (2006.01)
*H03H 9/24* (2006.01)

(52) U.S. Cl.
CPC ........... *H03H 9/02157* (2013.01); *H03H 9/205* (2013.01); *H03H 9/2405* (2013.01); *H03H 9/02574* (2013.01);
(Continued)

(58) Field of Classification Search
CPC .................. H01L 41/047; H01L 41/0477

USPC .................................................. 310/320–322
See application file for complete search history.

(56) References Cited

U.S. PATENT DOCUMENTS 6,385,429 B1    5/2002  Weber et al.
6,441,539 B1 *  8/2002  Kitamura et al. ............. 310/346
(Continued)

FOREIGN PATENT DOCUMENTS

WO   WO 2010144728 A1   12/2010
WO   WO 2013028638 A2    2/2013

OTHER PUBLICATIONS

International Search Report and Written Opinion—PCT/US2013/056614—ISA/EPO—Sep. 27, 2013.

*Primary Examiner* — Derek Rosenau
(74) *Attorney, Agent, or Firm* — Weaver Austin Villeneuve & Sampson LLP

(57) ABSTRACT

This disclosure provides systems, methods and apparatus related to acoustic resonators that include composite transduction layers for enabling selective tuning of one or more acoustic or electromechanical properties. In one aspect, a resonator structure includes one or more first electrodes, one or more second electrodes, and a transduction layer arranged between the first and second electrodes. The transduction layer includes a plurality of constituent layers. In some implementations, the constituent layers include one or more first piezoelectric layers and one or more second piezoelectric layers. The transduction layer is configured to, responsive to signals provided to the first and second electrodes, provide at least a first mode of vibration of the transduction layer with a displacement component along the z axis and at least a second mode of vibration of the transduction layer with a displacement component along the plane of the x axis and the y axis.

30 Claims, 13 Drawing Sheets

(52) U.S. Cl.
CPC .............. *H03H 2009/02503* (2013.01); *H03H 2009/02527* (2013.01); *H03H 2009/241* (2013.01)

(56) References Cited

U.S. PATENT DOCUMENTS

| | | |
|---|---|---|
| 7,675,389 B2 | 3/2010 | Yamakawa et al. |
| 8,513,863 B2 | 8/2013 | Stephanou et al. |
| 2006/0176126 A1* | 8/2006 | Wang et al. .................... 333/187 |
| 2007/0063622 A1* | 3/2007 | Rudy ............................ 310/341 |
| 2007/0267942 A1 | 11/2007 | Matsumoto et al. |
| 2010/0148636 A1* | 6/2010 | Nishihara et al. ............. 310/365 |
| 2011/0001394 A1 | 1/2011 | Dalla Piazza et al. |
| 2011/0121683 A1 | 5/2011 | Milyutin et al. |
| 2012/0038431 A1 | 2/2012 | Jaakkola et al. |
| 2012/0177816 A1 | 7/2012 | Larson, III |
| 2013/0214643 A1 | 8/2013 | Zuo et al. |

* cited by examiner (W=1.5μm, T=2μm)

(W=1.5μm, T=2μm)

(W=1.5μm, T=2μm)

COMPOSITE DILATION MODE RESONATORS

TECHNICAL FIELD

This disclosure relates generally to electromechanical acoustic devices, and more specifically to acoustic resonators that include composite transduction layers.

DESCRIPTION OF THE RELATED TECHNOLOGY

Electromechanical systems (EMS) include devices having electrical and mechanical elements, transducers such as actuators and sensors, optical components (including mirrors), and electronics. EMS can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography, or other micromachining processes that etch away parts of substrates or deposited material layers, or that add layers to form electrical, mechanical, and electromechanical devices.

Elastic (or acoustic) wave devices are utilized in a variety of applications including frequency control applications. For example, acoustic wave devices can be utilized in transmitters, receivers, transceivers, filters, clock oscillators, delay lines, delay line oscillators, among other example applications. In some implementations, the acoustic wave devices are acoustic wave resonating devices or "resonators" having one or more resonant frequencies. In many implementations of such acoustic wave devices (also known as electromechanical acoustic wave devices), electrical energy is transduced into mechanical energy (e.g., vibrations or elastics waves), and vice versa.

Acoustic wave resonators and other acoustic wave devices also are typical in filtering applications. Frequency bandpass filters, for example, are utilized in radio architectures employed by wireless devices such as consumer mobile handsets. Contemporary handsets may operate across multiple communication standards and multiple frequency bands. These demands have necessitated the integration of multiple discrete filters within the radio-frequency front-end module (RF-FEM) of such handsets or other wireless devices. In order to meet the requisite performance specifications, these filters have been synthesized from electromechanical device "building blocks" such as surface acoustic wave (SAW) devices, film bulk acoustic wave resonators (FBAR), and bulk acoustic wave (BAW) resonators. Traditional SAW, FBAR, and BAW devices are inherently discrete devices. As the number of bands being utilized increases, integrating the increasing number of required discrete filter components and other components into a single system-in-package (SiP) becomes an increasingly problematic endeavor in terms of module cost and size, as well as system design and supply chain management complexity.

Other examples of conceptual solutions have been proposed to enable higher levels of multi-frequency integration including: contour mode resonators (CMR) having operating frequencies that are substantially determined by lithographically-defined in-plane dimensions; multi-structural layer FBAR implementations involving shadow masking or buried etch stop layers; and FBAR-like structures topped with lithographically-defined "tuning patterns."

SUMMARY

The systems, methods and devices of this disclosure each have several innovative aspects, no single one of which is solely responsible for the desirable attributes disclosed herein.

One innovative aspect of the subject matter described in this disclosure can be implemented in a resonator structure that includes a first conductive layer including one or more first electrodes, a second conductive layer including one or more second electrodes, and a transduction layer arranged between the first conductive layer and the second conductive layer. The transduction layer has a thickness along a z axis, a width along an x axis, and a length along a y axis. The transduction layer includes a plurality of constituent layers. In some implementations, the plurality of constituent layers includes a first set of one or more first piezoelectric layers each formed of a first piezoelectric material having a first set of piezoelectric coefficients and a first set of stiffness coefficients. In some implementations, the plurality of constituent layers further includes a second set of one or more second piezoelectric layers each formed of a second piezoelectric material having a second set of piezoelectric coefficients and a second set of stiffness coefficients. In some implementations, the transduction layer is configured to, responsive to one or more signals provided to each of one or more of the first electrodes and the second electrodes, provide at least a first mode of vibration of the transduction layer with a displacement component along the z axis and at least a second mode of vibration of the transduction layer with a displacement component along the plane of the x axis and the y axis.

In some implementations, the constituent layers can include three or more constituent layers that are arranged symmetrically relative to a mid-plane of the transduction layer along the y and z axes. In some such implementations, the constituent layers can alternate periodically along the x axis from the mid-plane. In some implementations, the constituent layers can be arranged in an "ABA" pattern, an "ABABA" pattern, or an "ABABABA" pattern, where "A" represents a first piezoelectric layer from the first set and "B" represents a second piezoelectric layer from the second set. In some implementations, the constituent layers can include a third set of one or more layers each formed of a third material having a third set of stiffness coefficients. In some implementations, the constituent layers can include one or more gaps or voids between adjacent ones of the constituent layers. In various implementations, each of the constituent layers can have substantially the same height along the z axis and substantially the same length along the y axis. In such implementations, an upper surface of each of the constituent layers can be substantially horizontally-aligned with the upper surfaces of the other ones of the constituent layers.

In some implementations, a resonant frequency of the resonator structure can be a function of at least the thickness of the transduction layer, the first set of stiffness coefficients, and the second set of stiffness coefficients. In some implementations, the resonant frequency also can be a function of a mass density of at least one of the first piezoelectric material and the second piezoelectric material. In some implementations, the resonant frequency also can be a function of at least one of the first set of piezoelectric coefficients and the second set of piezoelectric coefficients. In some implementations, the resonant frequency can be tuned during fabrication of the device by selectively adjusting the ratio of the combined width of all of the second piezoelectric layers to the entire width of the transduction layer. In some implementations an electromechanical coupling of the transduction layer can be a function of at least one of the first set of piezoelectric coefficients and the second set of piezoelectric coefficients.

Another innovative aspect of the subject matter described in this disclosure can be implemented in a device that includes an array of resonator structures. The array of resonator structures includes a plurality of sets of one or more resonator structures. Each resonator structure includes a first conductive layer including one or more first electrodes, a second conductive layer including one or more second electrodes, and a transduction layer arranged between the first conductive layer and the second conductive layer. The transduction layer has a thickness along a z axis, a width along an x axis, and a length along a y axis. The transduction layer includes a plurality of constituent layers that have substantially coplanar upper surfaces. In some implementations, the plurality of constituent layers includes a first set of one or more first piezoelectric layers each formed of a first piezoelectric material having a first set of piezoelectric coefficients and a first set of stiffness coefficients, and a second set of one or more second piezoelectric layers each formed of a second piezoelectric material having a second set of piezoelectric coefficients and a second set of stiffness coefficients. In some implementations, the transduction layer is configured to, responsive to one or more signals provided to each of one or more of the first electrodes and the second electrodes, provide at least a first mode of vibration of the transduction layer with a displacement component along the z axis and at least a second mode of vibration of the transduction layer with a displacement component along the plane of the x axis and the y axis. In some implementations, a thickness of the transduction layer of each resonator structure is substantially equal to the thicknesses of the transduction layers in all the other resonator structures in the array of resonator structures. In some such implementations, an effective combination of the first and second piezoelectric coefficients and the first and second stiffness coefficients in the transduction layer of each resonator structure in each set of resonator structures is substantially the same combination as in the other resonator structures of the set and different than the combinations in the other resonator structures of all the other sets in the array of resonator structures.

In some implementations, the constituent layers of each transduction layer of each resonator structure can include three or more constituent layers that are arranged symmetrically relative to a mid-plane of the transduction layer along the y and z axes. In some such implementations, the constituent layers can alternate periodically along the x axis from the mid-plane. In some implementations, the constituent layers can include a third set of one or more layers each formed of a third material having a third set of stiffness coefficients. In some implementations, the constituent layers can include one or more gaps or voids between adjacent ones of the constituent layers.

In some implementations, a resonant frequency of each resonator structure can be a function of at least the thickness of the transduction layer of the resonator structure, the first set of stiffness coefficients of the resonator structure, and the second set of stiffness coefficients of the resonator structure. In some implementations, the resonant frequency also can be a function of a mass density of at least one of the first piezoelectric material and the second piezoelectric material. In some implementations, the resonant frequency can be tuned during fabrication of the device by selectively adjusting the ratio of the combined width of all of the second piezoelectric layers to the entire width of the transduction layer. In some implementations, an electromechanical coupling of the transduction layer can be a function of at least one of the first set of piezoelectric coefficients and the second set of piezoelectric coefficients.

Another innovative aspect of the subject matter described in this disclosure can be implemented in a device. The device includes first conductive means including one or more first electrodes, second conductive means including one or more second electrodes, and transduction means arranged between the first conductive means and the second conductive means. The transduction means has a thickness along a z axis, a width along an x axis, and a length along a y axis. The transduction means include two or more constituent layers. In some implementations, the two or more constituent layers include a first set of one or more first piezoelectric means each formed of a first piezoelectric material having a first set of piezoelectric coefficients and a first set of stiffness coefficients, and a second set of one or more second piezoelectric means each formed of a second piezoelectric material having a second set of piezoelectric coefficients and a second set of stiffness coefficients. In some implementations, the transduction means includes means for, responsive to one or more signals provided to each of one or more of the first electrodes and the second electrodes, providing at least a first mode of vibration of the transduction means with a displacement component along the z axis and at least a second mode of vibration of the transduction means with a displacement component along the plane of the x axis and the y axis.

In some implementations, the constituent layers can include three or more constituent layers that are arranged symmetrically relative to a mid-plane of the transduction layer along the y and z axes. In some such implementations, the constituent layers can alternate periodically along the x axis from the mid-plane. In some implementations, each of the constituent layers can have substantially the same height along the z axis. In some such implementations, an upper surface of each of the constituent layers can be substantially horizontally-aligned with the upper surfaces of the other ones of the constituent layers.

In some implementations, a resonant frequency of the device can be a function of at least the thickness of the transduction means, the first set of stiffness coefficients, and the second set of stiffness coefficients. In some implementations, the resonant frequency also can be a function of a mass density of at least one of the first piezoelectric material and the second piezoelectric material. In some implementations, the resonant frequency can be tuned during fabrication of the device by selectively adjusting the ratio of the combined width of all of the second piezoelectric means to the entire width of the transduction means. In some implementations, an electromechanical coupling of the transduction means can be a function of at least one of the first set of piezoelectric coefficients and the second set of piezoelectric coefficients.

Details of one or more implementations of the subject matter described in this specification are set forth in the accompanying drawings and the description below. Although some of the examples provided in this disclosure may be described in terms of EMS and MEMS-based displays, the concepts provided herein may apply to other types of displays, such as liquid crystal displays (LCDs), organic light-emitting diode (OLED) displays and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
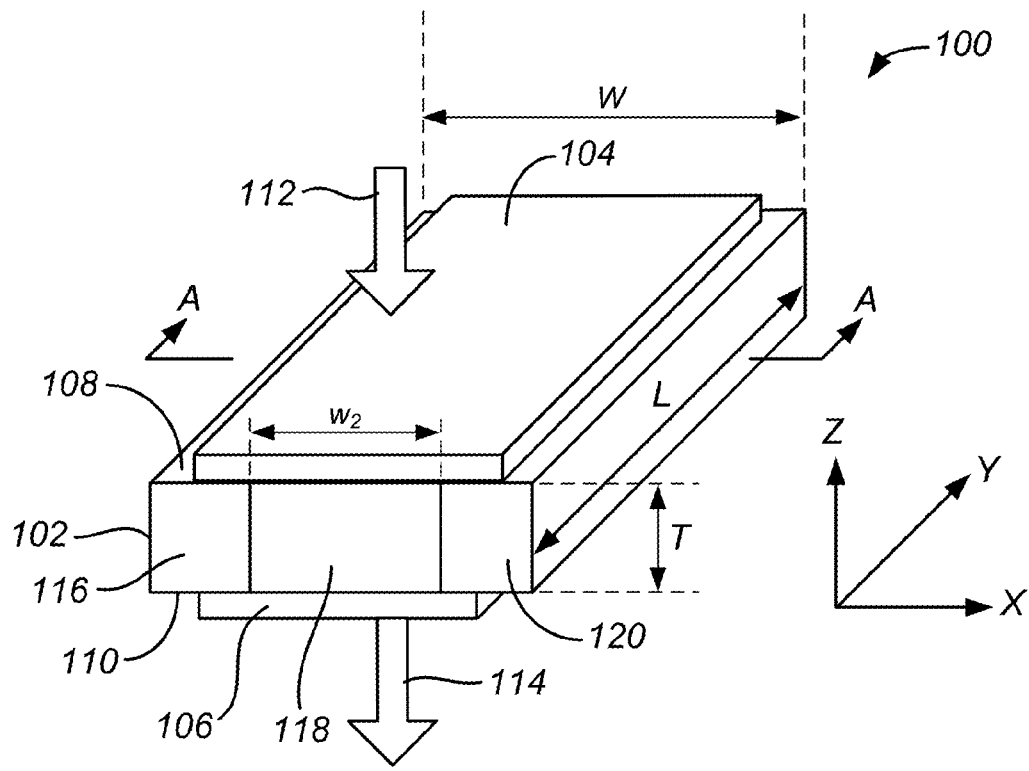
FIG. 1 shows a cross-sectional perspective view of a portion of a cross-sectional dilation mode resonator (XDMR) structure that includes a composite transduction layer.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The disclosed implementations include examples of structures and configurations of acoustic (or "elastic wave") devices including electromechanical systems (EMS) devices. Related apparatus, systems, and fabrication processes and techniques are also disclosed. In some implementations, the acoustic devices are configured as dilation mode resonators (DMRs). Some implementations relate specifically to cross-sectional DMRs (XDMRs) that have one or more two-dimensional (2D) modes of vibration in one or more cross-sectional planes of the resonator structure. That is, with displacement and deformation along the thickness of the resonator structure and along the lateral width or length of the resonator structure. Some other implementations relate to DMRs that have a three-dimensional (3D) mode of vibration, with displacement and deformation along both a thickness-width cross-section and a thickness-length cross-section of the resonator structure. Some implementations relate to XDMRs or other acoustic devices that include a composite transduction layer that includes a plurality of constituent layers. In some implementations, the plurality of constituent layers of the composite transduction layer includes a first set of one or more first piezoelectric layers each formed of a first piezoelectric material. In some implementations, the plurality of constituent layers of the composite transduction layer also includes a second set of one or more second piezoelectric layers each formed of a second piezoelectric material. In some implementations, the upper surfaces of the constituent layers are coplanar. In some such implementations, a plurality or an array of such XDMR or other acoustic devices can be produced on a single substrate and have selectively prescribed acoustic or other electromechanical characteristics while also having a uniform height.

Some implementations also include examples of methods, processes, or techniques for selectively prescribing or tuning one or more acoustic or electromechanical characteristics of such XDMR or other acoustic devices, such as one or more characteristics of one or more 2D or 3D modes of vibration. For example, one or more acoustic or other electromechanical characteristics of XDMR and other acoustic devices described herein can be selectively prescribed by selecting the first piezoelectric material, selecting the second piezoelectric material, and selectively arranging the first and second piezoelectric layers. For example, the respective widths of the one or more first piezoelectric layers, the respective widths of the one or more second piezoelectric layers, the number of the first piezoelectric layers, the number of the second piezoelectric layers, and the periodicity of the first and second piezoelectric layers can be chosen to achieve the desired acoustic or other electromechanical characteristics. In some other implementations, one or more other material layers or voids can be arranged with the first and second piezoelectric layers to achieve the desired acoustic or other electromechanical characteristics.

Particular implementations of the subject matter described in this disclosure can be implemented to realize one or more of the following potential advantages. Some implementations enable batch- or substrate-level fabrication of multiple thin-film acoustic wave devices with independently- or otherwise selectively-prescribed acoustic or other electromechanical characteristics on a single substrate. Some implementations enable co-fabrication of an array of acoustic wave filters—each incorporating one or more XDMRs or other acoustic devices described herein—on the same substrate that address multiple independent frequencies but that share the same uniform height. For example, in some implementations the resonant frequency of each device can be prescribed or tuned during fabrication of the device by selectively adjusting the ratio of the combined width of all of the piezoelectric layers of either the first set of piezoelectric layers or the second set of piezoelectric layers to the entire width of the transduction layer. Generally, many implementations enable significant improvements in component count reduction and opportunities for integration. Additionally, the disclosed XDMRs also provide higher electromechanical coupling, $k_t^2$, than is possible with some conventional resonators.

Within the transduction layer, electrical energy is transduced into mechanical energy (e.g., vibrations or elastics waves), and vice versa. In some such implementations, the electromechanical transduction mechanism can be piezoelectric. In other such implementations, the electromechanical transduction mechanism can be electrostatic (such as electrostatically-transduced silicon (Si)). Examples of other transduction mechanisms that can be used in some other implementations include electromagnetic, photoelectric and thermoelectric, among other mechanisms.

The acoustic and electromechanical characteristics of the devices described herein can be determined by material properties and device dimensions. For example, the natural resonant frequencies of thin-film acoustic wave resonators are determined by both the material properties of their constituent layers as well as one or more characteristic geometrical dimensions. For example, the material properties generally have a greater contribution in determining the propagation velocity of the elastic ("acoustic") waves through the piezoelectric material or other structural material in which transduction or propagation occurs. The characteristic geometrical dimension or dimensions, on the other hand, generally have a greater contribution in determining at what wavelengths the waves can form standing wave patterns in the piezoelectric material layer or other structural material layer (the wavelengths that correspond to the "resonant frequencies" of the devices). In an XDMR, the characteristic dimensions are the thickness and, generally, the width of the transduction layer. Additionally or alternately, the length also can be a characteristic dimension.

In various implementations of the XDMRs, DMRs, or other acoustic devices described herein, electrodes are generally disposed in contact with or in proximity to the transduction layer. For example, the electrodes can be located on the same surface or on opposite surfaces of one or more piezoelectric or other layers of the transduction layer. An electric field applied between electrodes is transduced into a mechanical strain in the piezoelectric material. For example, a time-varying electrical signal can be provided to an input electrode of a DMR and transduced to a corresponding time-varying mechanical motion. A portion of this mechanical energy can be transferred back to electrical energy at the input electrode or at an output electrode. The frequency of the input electrical signal that produces the greatest substantial amplification of the mechanical displacement in the transduction layer is generally referred to as a resonant frequency of the DMR. Generally, the modes of vibration of the transduction layer are dictated by the stiffness coefficients (i.e., the Young's modulus in isotropic media), the piezoelectric coefficients, the mass density, and the characteristic dimension or dimensions of the transduction layer.

The stiffness coefficients relating normal strains to normal stresses may be expressed using compressed indicial notation as $c_{11}$, $c_{22}$, and $c_{33}$. For example, $c_{11}$ quantifies the ratio of normal stress along the horizontal "1" or "x" direction (e.g., along a width of the piezoelectric layer) to normal strain along the x direction. Similarly, $c_{22}$ quantifies the ratio of normal stress along the horizontal "2" or "y" direction (e.g., along a length of the piezoelectric layer) to normal strain along the y direction. Similarly, $c_{33}$ quantifies the ratio of normal stress along the vertical "3" or "z" direction (e.g., along a thickness of the piezoelectric layer) to normal strain along the z direction. In some cases, the elastic response along a particular direction of an anisotropic medium may be represented using an equivalent stiffness or Young's modulus.

Similarly, the piezoelectric coefficients can be expressed using compressed indicial notation. For example, the $d_{33}$ piezoelectric coefficient quantifies the normal strain in the vertical 3 or z direction in response to an electric field applied in the z direction. Similarly, the $d_{31}$ piezoelectric coefficient quantifies the normal strain in the horizontal 1 or x direction (e.g., along a width of the piezoelectric layer) in response to an electric field applied in the z direction while the $d_{32}$ piezoelectric coefficient quantifies the normal strain in the horizontal 2 or y direction (e.g., along a length of the piezoelectric layer) in response to an electric field applied in the z direction. Some other piezoelectric coefficients include the $d_{24}$ coefficient (associated with yz-shear displacement in response to an electrical field applied in the y direction) and the $d_{15}$ coefficient (associated with xz-shear displacement in response to an electrical field applied in x direction).

FIG. 1 shows a cross-sectional perspective view of a portion of an XDMR structure 100 that includes a composite transduction layer 102. The structure 100 includes a first (or upper) conductive layer 104 including one or more first electrodes. The structure 100 also includes a second (or lower) conductive layer 106 including one or more second electrodes offset from the upper conductive layer 104 along a z axis. The transduction layer 102 is disposed between the upper conductive layer 104 and the lower conductive layer 106. In this example, the transduction layer 102 has an upper surface 108 and a lower surface 110 opposite the upper surface 108. In this example, the upper surface 108 of the transduction layer 102 is in contact with the upper conductive layer 104, and the lower surface 110 of the transduction layer 102 is in contact with the lower conductive layer 106.

The transduction layer 102 has dimensions including a width, W, oriented along an x axis, a length, L, oriented along a y axis perpendicular to the x axis, and a thickness, T, along the z axis, which is perpendicular to the x axis and the y axis. While the transduction layer 112 of FIG. 1 is represented as a rectangular prism or cube, with dimensions oriented along respective x, y, and z axes as described above, it should be understood that this representation is for illustrative purposes only. The width W and length L are examples of lateral distances, D, which generally lie in a plane along the x axis and the y axis. A ratio T/D of the thickness T and a lateral distance D can be configured to provide a 2D mode of vibration of the transduction layer 102 with vertical displacement along the z axis and lateral displacement along a lateral plane perpendicular to the z axis, responsive to a signal provided to one or more of the electrodes in the upper and lower conductive layers 104 and 106. For example, the lateral displacement can be along the x axis in some examples, along the y axis in some other examples, or along a direction offset from the x and y axes. For example, an input AC signal 112 having a frequency causing the structure 100 to vibrate at a resonant frequency can be provided to one or more electrodes of the upper conductive layer 104 and/or to one or more electrodes of the lower conductive layer 106. A resulting output signal 114 having the resonant frequency can be sensed by one or more electrodes of the upper conductive layer 104 and/or by one or more electrodes of the lower conductive layer 106.

In some implementations, one or both of the upper and lower conductive layers 104 and 106 cover a substantial portion of the upper and lower surfaces 108 and 110, respectively, on which the conductive layers are disposed. In the example of FIG. 1, the upper conductive layer 104 of one or more electrodes covers a substantial portion of the upper surface 108 of the transduction layer 102, and the lower conductive layer 106 of one or more electrodes covers a substantial portion of the lower surface 110 of the transduction layer 102. In some implementations, more than about 50% and as high as about 100% of the surface area of a respective surface 108 or 110 is covered by electrodes of the respective conductive layer. In most cases, the more the surface 108 or 110 is covered by a conductive layer, the greater the electromechanical coupling $k_t^2$.

While the XDMR structure 100 of FIG. 1 is a two-port resonator, that is, with an input signal 112 delivered to an input terminal represented by upper conductive layer 104 and an output signal 114 provided to an output terminal represented by lower conductive layer 106, the same or similar 2D and 3D modes of vibration as described herein can be attained with one-port resonators. For example, in an alternative implementation, the lower conductive layer 106 is coupled to ground, and the upper conductive layer 104 serves as a signal terminal at which both the input signal is delivered and the output signal is sensed. In such implementations, the upper conductive layer 104 can include one or more electrodes that deliver the input signal and one or more other electrodes that from which the output signal is sensed.

As described above, the composite transduction layers described herein include a plurality of constituent layers including one or more piezoelectric layers. In the example implementation depicted in FIG. 1, the transduction layer 102 is fabricated to include three constituent piezoelectric layers. The transduction layer 102 includes a first layer 116 formed of a first piezoelectric material, a second layer 118 formed of a second piezoelectric material, and a third layer 120 formed of the first piezoelectric material. All of the constituent layers 116, 118, and 120 have approximately coplanar upper surfaces. The first piezoelectric material is characterized by a first set of stiffness coefficients, a first set of piezoelectric coefficients, and a first mass density. The second piezoelectric material is characterized by a second set of stiffness coefficients, a second set of piezoelectric coefficients, and a second mass density. For example, the first piezoelectric material can be zinc oxide (ZnO). In some such implementations, the second piezoelectric material can be aluminum nitride (AlN).

In some implementations, the modes of vibration and the resonant frequency of the XDMR structure 100 are controlled during fabrication of the transduction layer 102 by selectively designing or configuring the ratio of the width $w_2$ of the second piezoelectric layer 118 to the total width W of the transduction layer 102. More specifically, the modes of vibration and the resonant frequency of the transduction layer 102 depend on the effective stiffness coefficients, the effective piezoelectric coefficients, and the effective mass density of the entire transduction layer 102, the thickness T, and in some implementations, the total width W (in some other thickness-mode implementations such as FBARs, the width W may not be a factor in modes of vibration and resonant frequency). The effective stiffness coefficients, the effective piezoelectric coefficients, and the effective mass density of the entire transduction layer 102 are, in turn, dependent on the relative volumes of the constituent layers 116, 118, and 120 and possibly on the arrangement of those volumes. Because, in the example shown in FIG. 1, the lengths of all of the constituent layers 116, 118, and 120 are equal to L and because the thicknesses of all of the constituent layers 116, 118, and 120 are equal to T, the result is that the effective stiffness coefficients, the effective piezoelectric coefficients, and the effective mass density of the entire transduction layer 102 are dependent on the relative widths $w_1$, $w_2$, and $w_3$, respectively, of the constituent layers 116, 118, and 120, respectively. Thus, in the example shown in FIG. 1, because the stiffness coefficients, the piezoelectric coefficients, and the mass density of the second piezoelectric layer 118 are different than the stiffness coefficients, the piezoelectric coefficients, and the mass densities of the first and third piezoelectric layers 116 and 120, the effective stiffness coefficients, the effective piezoelectric coefficients, and the effective mass density of the entire transduction layer 102 can be selectively adjusted by configuring the ratio of the width $w_2$ of the second piezoelectric layer 118 to the total width W of the transduction layer 102. In this way, the modes of vibration and the resonant frequency of the XDMR structure 100 can be selectively prescribed during fabrication. Additionally, because the electromechanical coupling $k_t^2$ is determined by the effective piezoelectric coefficients, such as $d_{31}$ and $d_{33}$, of the entire transduction layer 102, the electromechanical coupling $k_t^2$ also can be selectively prescribed during fabrication or mask design by configuring the ratio of the width $w_2$ of the second piezoelectric layer 118 to the total width W of the transduction layer 102.

Figure 2:
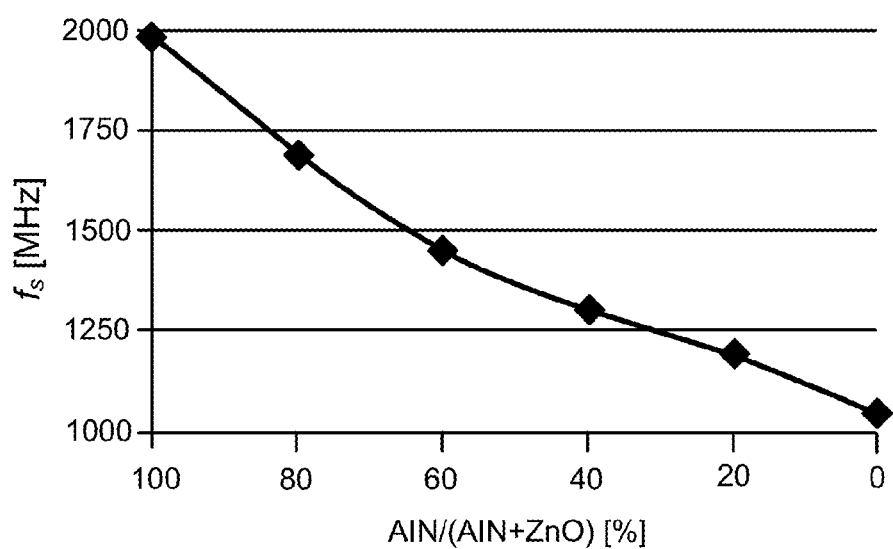
FIG. 2 shows a plot depicting a relationship between the two-dimensional mode frequency in MHz and the ratio, expressed as a percentage, of the width $w_2$ of the second piezoelectric layer to the total width W of the transduction layer in an example XDMR structure.
Figure 3:
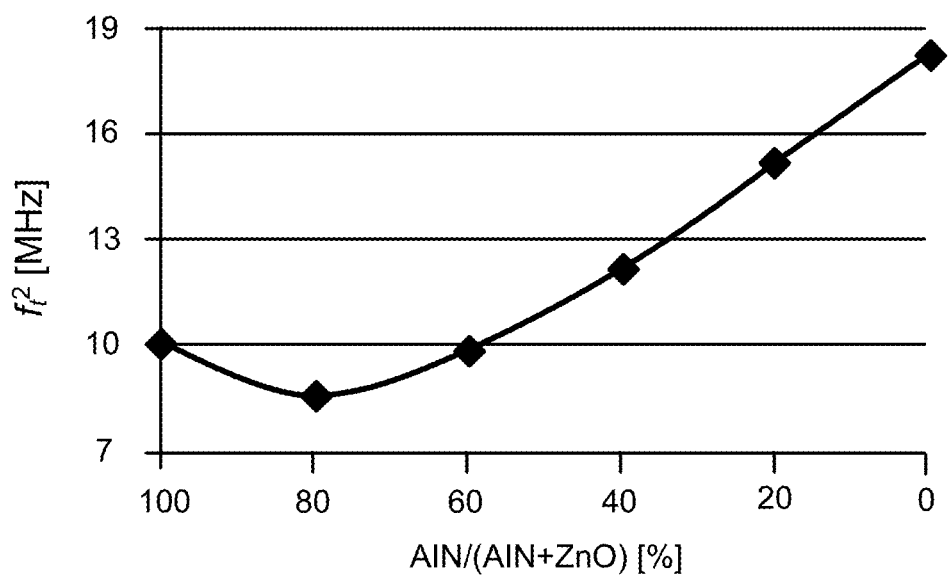
FIG. 3 shows a plot depicting a relationship between the electromechanical coupling $k_t^2$, expressed as a percentage, and the ratio, also expressed as a percentage, of the width $w_2$ of the second piezoelectric layer to the total width W of the transduction layer in an example XDMR structure.

FIG. 2 shows a plot depicting a relationship between the 2D mode frequency in MHz and the ratio, expressed as a percentage, of the width $w_2$ of the second piezoelectric layer to the total width W of the transduction layer in an example XDMR structure. For example, the XDMR structure can be similar to the XDMR structure 100 described above. The plot of FIG. 2 (and subsequent plots shown herein) represents a relationship in which the second piezoelectric material is AN and the first piezoelectric material is ZnO. FIG. 3 shows a plot depicting a relationship between the electromechanical coupling $k_t^2$, expressed as a percentage, and the ratio, also expressed as a percentage, of the width $w_2$ of the second piezoelectric layer to the total width W of the transduction layer in an example XDMR structure. Again the XDMR structure can be similar to the XDMR structure 100 described above. Other frequency and electromechanical coupling $k_t^2$ relationships can be achieved using other piezoelectric materials, or other arrangement as described later.

Figure 4:
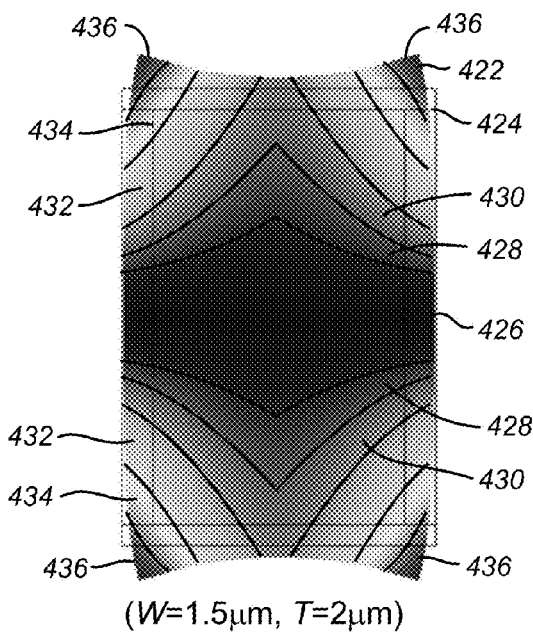
FIG. 4 shows an example of a geometric vibrational mode shape in a cross-section of the transduction layer in an example XDMR structure.

FIG. 4 shows an example of a geometric vibrational mode shape 422 in a cross-section of the transduction layer in an example XDMR structure. For example, the XDMR structure can be similar to the XDMR structure 100 described above, and thus, for purposes of explaining FIG. 4 and subsequent figures, reference may be made to certain elements of FIG. 1. In particular, FIG. 4 shows a front cross-sectional view of the transduction layer 102 taken along lines A-A of FIG. 1. For purposes of illustrating a 2D dilation mode shape 422, in FIG. 4, the rectangular shape 424 indicates the cross-sectional shape of the transduction layer 102 before excitation and deformation. In FIG. 4, the z axis bisects the transduction layer 102 along its width, and the x axis bisects the transduction layer 102 along its thickness. In this example, the illustrated 2D dilation mode shape 422 is achieved when the ratio of the width $w_2$ of the second piezoelectric layer 118 to the total width W of the transduction layer 102 is 80%. The 2D dilation mode shape 422 includes displacement along the z axis and along the x axis. In some other implementations, there also can be displacement along the y axis depending on the selected piezoelectric materials and dimensions. In the example of FIG. 4, the width W is 1.5 microns (μm) and the thickness T is 2 μm.

The displacement within the transduction layer 102 varies depending on the location within the cross-section. For instance, in a first region 426 of the cross-section of the transduction layer 102, including the intersection of the x and z axes, there is little or zero displacement. In a second region 428 of the piezoelectric layer 112, there is little to medium displacement, that is, generally more displacement than in region 426. The amount of displacement continues to increase moving away from the intersection of the x and z axes into regions 430, 432 and 434 with maximum displacement occurring in regions 436 at the corners of the cross-section. The displacement of the transduction layer 102 is such that the illustrated 2D mode has a symmetrical shape with respect to the z axis. In this example, the displacement is also symmetrical with respect to the x axis. However, the displacement in the thickness direction (the z direction in this example) is generally not uniform, because the amount of displacement in the z direction changes along the x axis. Similarly, displacement in the width direction (the x direction in this example) is generally not uniform, because the amount of displacement in the x direction changes along the z axis. In this example, the displacement in the 2D cross-section has strong components in the x and z directions, contributing to the non-uniform shape along the z and x axes, and providing high electromechanical coupling $k_2^2$.

Figure 5A:
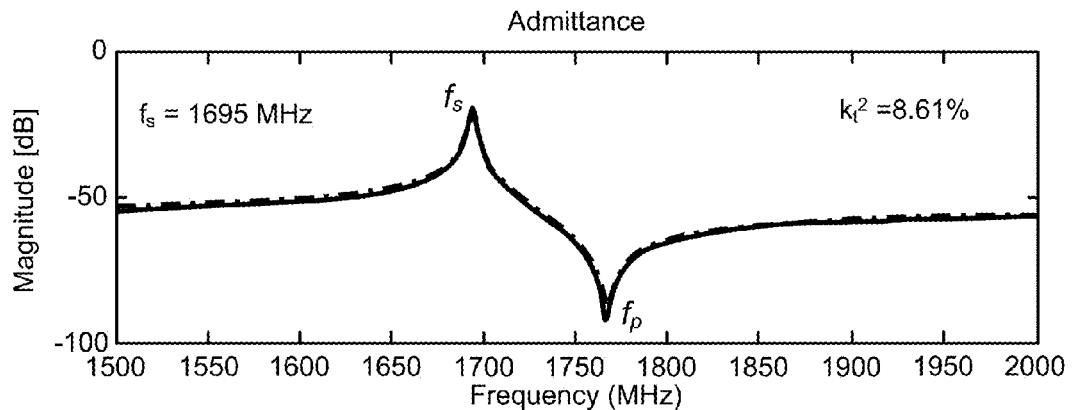
FIGS. 5A and 5B show plots depicting the magnitude and phase of the admittance, respectively, in relation to the frequency of an input AC signal provided to the example XDMR structure of FIG. 4.
Figure 5B:
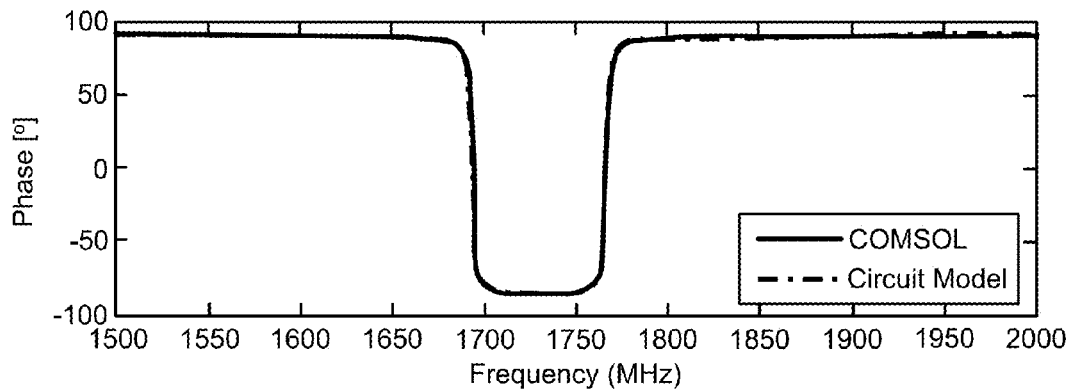

FIGS. 5A and 5B show plots depicting the magnitude and phase of the admittance, respectively, in relation to the frequency of an input AC signal provided to the example XDMR structure of FIG. 4. In FIG. 5A, the resonant frequency of the structure occurs between frequencies $f_s$, 1695 MHz in this example, and $f_p$. As illustrated in FIG. 5A, $f_s$ is the series resonant frequency and $f_p$ is the parallel resonant frequency. The electromechanical coupling $k_t^2$ is approximately 8.61%. In a region between $f_s$ and $f_p$, the phase drops from about 90 degrees to about −90 degrees, which can cause the resonator to exhibit inductive characteristics. Outside of this region, the resonator can exhibit capacitive characteristics in its electrical response.

Figure 6:
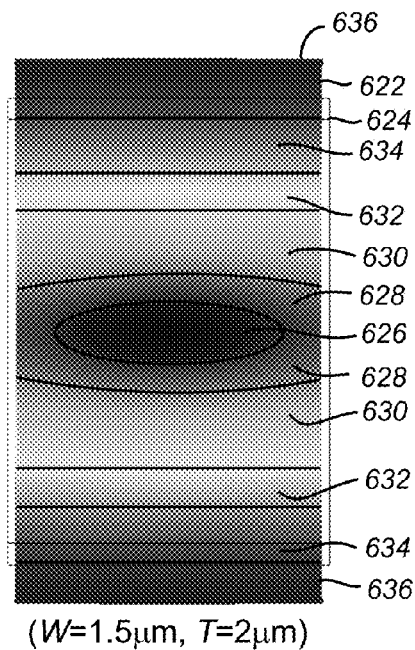
FIG. 6 shows an example of a geometric vibrational mode shape in a cross-section of a traditional piezoelectric layer.

FIG. 6 shows an example of a geometric vibrational mode shape 622 in a cross-section of a traditional piezoelectric layer. For purposes of illustrating the dilation mode shape 622, in FIG. 6, the rectangular shape 624 indicates the cross-sectional shape of the piezoelectric layer before excitation and deformation. In FIG. 6, the z axis bisects the piezoelectric layer along its width, and the x axis bisects the piezoelectric layer along its thickness. In this example, the illustrated dilation mode shape 622 is achieved with a single unitary piezoelectric layer formed of AlN. The dilation mode shape 622 consists primarily of vertical displacement along the z axis with little variation in the vertical displacement along the x axis. In the example of FIG. 6, the width W is again 1.5 μm and the thickness T is again 2 μm.

Figure 7A:
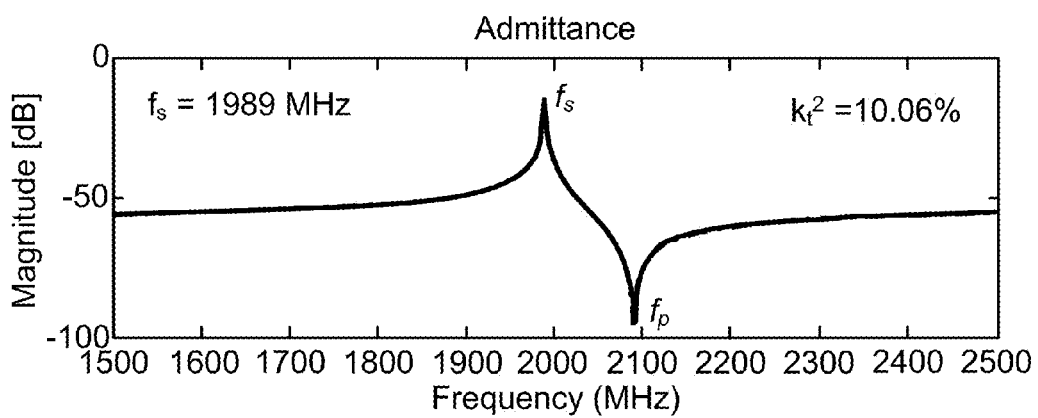
FIGS. 7A and 7B show plots depicting the magnitude and phase of the admittance, respectively, in relation to the frequency of an input AC signal provided to the example structure of FIG. 6.
Figure 7B:
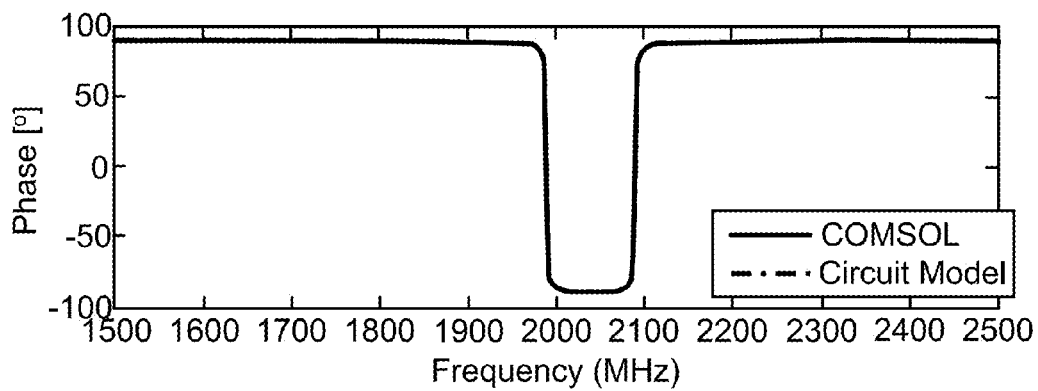

FIGS. 7A and 7B show plots depicting the magnitude and phase of the admittance, respectively, in relation to the frequency of an input AC signal provided to the example structure of FIG. 6. In FIG. 7A, the resonant frequency of the structure occurs between frequencies $f_s$, 1989 MHz in this example, and $f_p$. As illustrated in FIG. 7A, $f_s$ is the series resonant frequency and $f_p$ is the parallel resonant frequency. The electromechanical coupling $k_t^2$ is approximately 10.06%.

Figure 8:
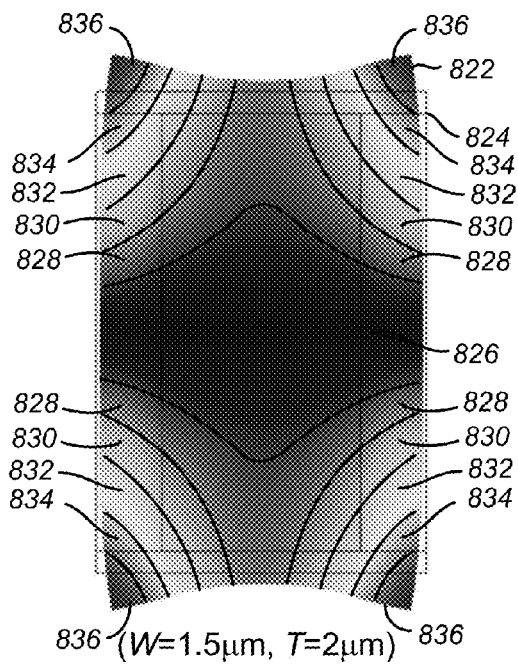
FIG. 8 shows an example of a geometric vibrational mode shape in a cross-section of the transduction layer in an example XDMR structure.

FIG. 8 shows an example of a geometric vibrational mode shape 822 in a cross-section of the transduction layer in an example XDMR structure. The rectangular shape 824 indicates the cross-sectional shape of the transduction layer 102 before excitation and deformation. In FIG. 8, the z axis bisects the transduction layer 102 along its width, and the x axis bisects the transduction layer 102 along its thickness. In this example, the illustrated 2D dilation mode shape 822 is achieved when the ratio of the width $w_2$ of the second piezoelectric layer 118 to the total width W of the transduction layer 102 is 60%. The 2D dilation mode shape 822 includes displacement along the z axis and along the x axis. Again, in some other implementations, there also can be displacement along the y axis depending on the selected piezoelectric materials and dimensions. In the example of FIG. 8, the width W is again 1.5 μm and the thickness T is again 2 μm.

As with the example shown in FIG. 4, the displacement within the transduction layer 102 varies depending on the location within the cross-section. For instance, in a first region 826 of the cross-section of the transduction layer 102, including the intersection of the x and z axes, there is little or zero displacement. In a second region 828 of the piezoelectric layer 112, there is little to medium displacement, that is, generally more displacement than in region 826. The amount of displacement continues to increase moving away from the intersection of the x and z axes into regions 830, 832 and 834 with maximum displacement occurring in regions 836 at the corners of the cross-section. The displacement of the transduction layer 102 is such that the illustrated 2D mode has a symmetrical shape with respect to the z axis and with respect to the x axis. As compared with the example of FIG. 4 in which the ratio $w_2/W$ was 80%, there is a different displacement profile and, consequently, a different electromechanical coupling $k_t^2$.

Figure 9A:
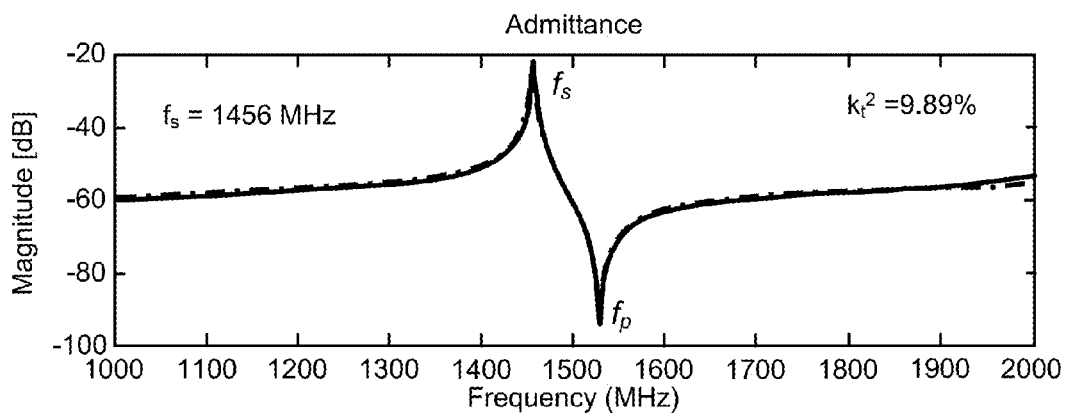
FIGS. 9A and 9B show plots depicting the magnitude and phase of the admittance, respectively, in relation to the frequency of an input AC signal provided to the example XDMR structure of FIG. 8.
Figure 9B:
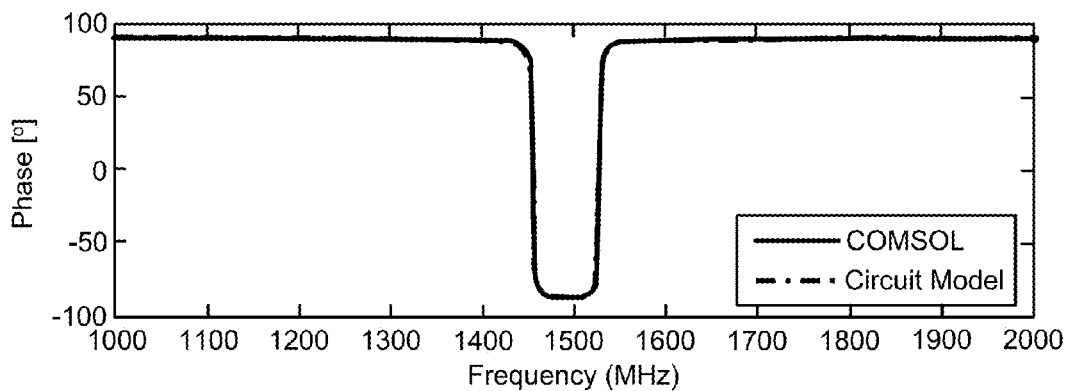

FIGS. 9A and 9B show plots depicting the magnitude and phase of the admittance, respectively, in relation to the frequency of an input AC signal provided to the example XDMR structure of FIG. 8. In FIG. 9A, the resonant frequency of the structure occurs between frequencies $f_s$, 1456 MHz in this example, and $f_p$. As illustrated in FIG. 9A, $f_s$ is the series resonant frequency and $f_p$ is the parallel resonant frequency. The electromechanical coupling $k_t^2$ is approximately 9.89%. As compared with the example of FIG. 4 in which the ratio $w_2/W$ was 80%, there is a decrease in the series resonant frequency $f_s$ while there is an increase in the electromechanical coupling $k_t^2$.

Figure 10:
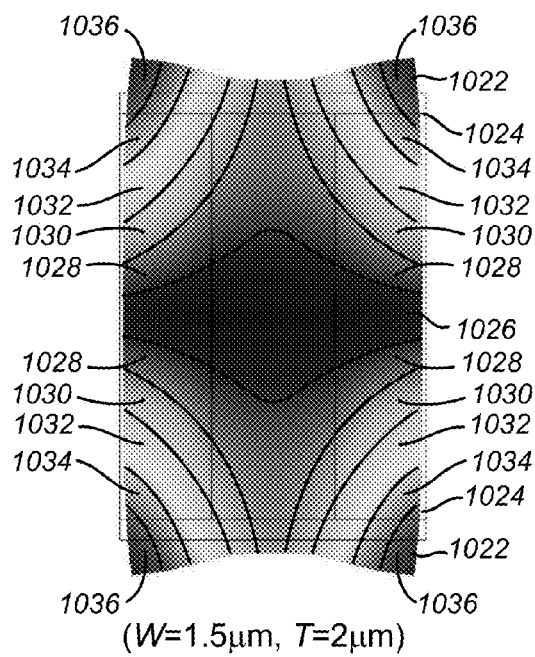
FIG. 10 shows an example of a geometric vibrational mode shape in a cross-section of the transduction layer in an example XDMR structure.

FIG. 10 shows an example of a geometric vibrational mode shape 1022 in a cross-section of the transduction layer in an example XDMR structure. The rectangular shape 1024 indicates the cross-sectional shape of the transduction layer 102 before excitation and deformation. In FIG. 10, the z axis bisects the transduction layer 102 along its width, and the x axis bisects the transduction layer 102 along its thickness. In this example, the illustrated 2D dilation mode shape 1022 is achieved when the ratio of the width $w_2$ of the second piezoelectric layer 118 to the total width W of the transduction layer 102 is 40%. The 2D dilation mode shape 1022 includes displacement along the z axis and along the x axis. Again, in some other implementations, there also can be displacement along the y axis depending on the selected piezoelectric materials and dimensions. In the example of FIG. 10, the width W is again 1.5 μm and the thickness T is again 2 μm.

As with the examples shown in FIG. 4 and FIG. 8, the displacement within the transduction layer 102 varies depending on the location within the cross-section. For instance, in a first region 1026 of the cross-section of the transduction layer 102, including the intersection of the x and z axes, there is little or zero displacement. In a second region 1028 of the piezoelectric layer 112, there is little to medium displacement, that is, generally more displacement than in region 1026. The amount of displacement continues to increase moving away from the intersection of the x and z axes into regions 1030, 1032 and 1034 with maximum displacement occurring in regions 1036 at the corners of the cross-section. The displacement of the transduction layer 102 is such that the illustrated 2D mode has a symmetrical shape with respect to the z axis and with respect to the x axis. As compared with the example of FIG. 8 in which the ratio $w_2/W$ was 60%, there is a different displacement profile and, consequently, a different electromechanical coupling $k_t^2$.

Figure 11A:
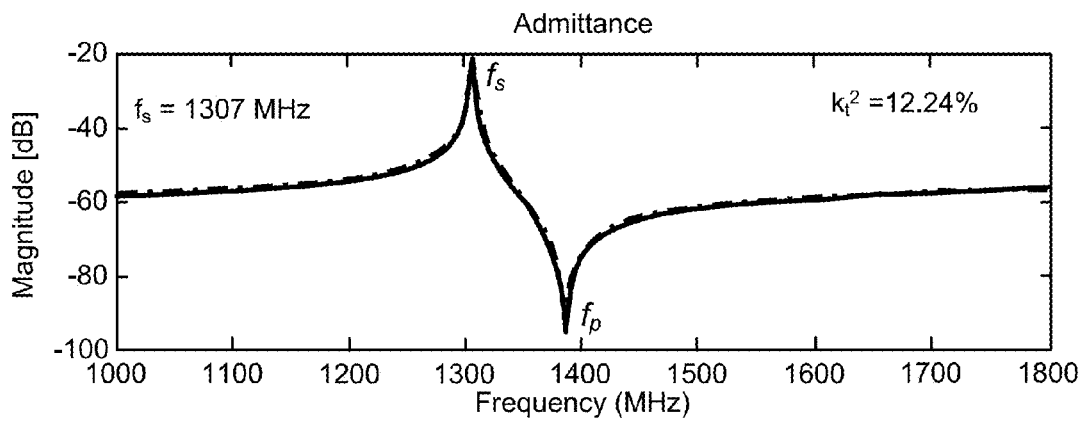
FIGS. 11A and 11B show plots depicting the magnitude and phase of the admittance, respectively, in relation to the frequency of an input AC signal provided to the example XDMR structure of FIG. 10.
Figure 11B:
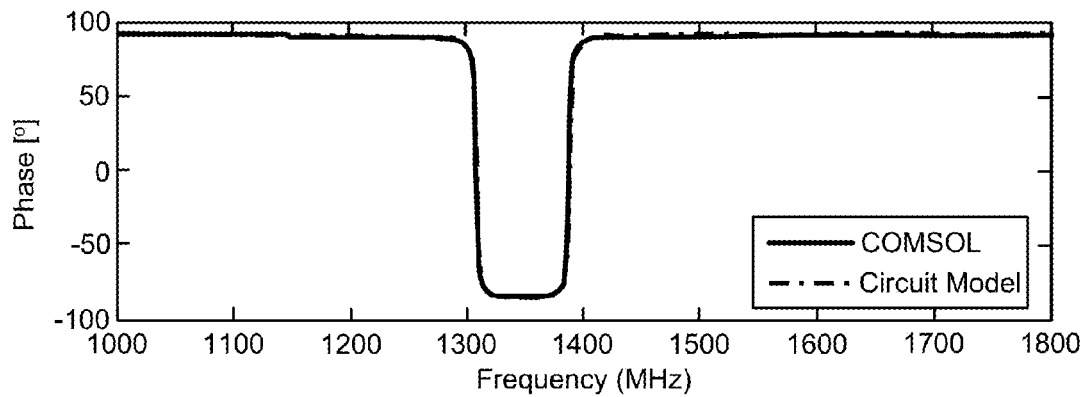

FIGS. 11A and 11B show plots depicting the magnitude and phase of the admittance, respectively, in relation to the frequency of an input AC signal provided to the example XDMR structure of FIG. 10. In FIG. 11A, the resonant frequency of the structure occurs between frequencies $f_s$, 1307 MHz in this example, and $f_p$. As illustrated in FIG. 11A, $f_s$ is the series resonant frequency and $f_p$ is the parallel resonant frequency. The electromechanical coupling $k_t^2$ is approximately 12.24%. As compared with the example of FIG. 8 in which the ratio $w_2/W$ was 60%, there is a decrease in the series resonant frequency $f_s$ while there is an increase in the electromechanical coupling $k_t^2$.

Figure 12:
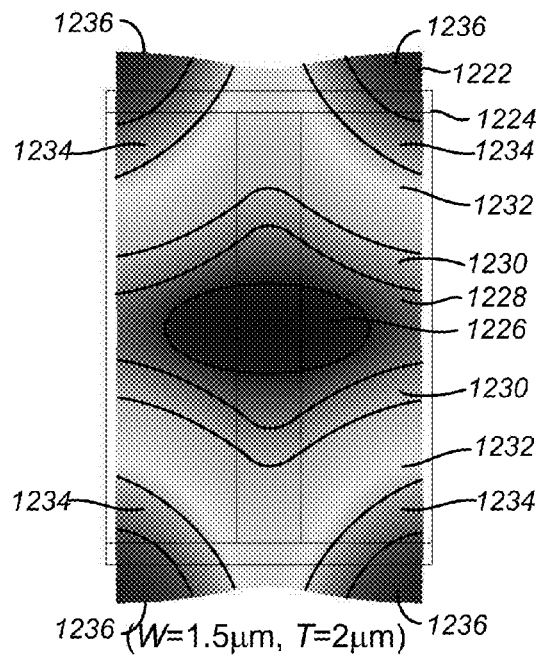
FIG. 12 shows an example of a geometric vibrational mode shape in a cross-section of the transduction layer in an example XDMR structure.

FIG. 12 shows an example of a geometric vibrational mode shape 1222 in a cross-section of the transduction layer in an example XDMR structure. The rectangular shape 1224 indicates the cross-sectional shape of the transduction layer 102 before excitation and deformation. In FIG. 12, the z axis bisects the transduction layer 102 along its width, and the x axis bisects the transduction layer 102 along its thickness. In this example, the illustrated 2D dilation mode shape 1222 is achieved when the ratio of the width $w_2$ of the second piezoelectric layer 118 to the total width W of the transduction layer 102 is 20%. The 2D dilation mode shape 1222 includes displacement along the z axis and along the x axis. Again, in some other implementations, there also can be displacement along the y axis depending on the selected piezoelectric materials and dimensions. In the example of FIG. 12, the width W is again 1.5 μm and the thickness T is again 2 μm.

As with the examples shown in FIG. 4, FIG. 8, and FIG. 10, the displacement within the transduction layer 102 varies depending on the location within the cross-section. For instance, in a first region 1226 of the cross-section of the transduction layer 102, including the intersection of the x and z axes, there is little or zero displacement. In a second region 1228 of the piezoelectric layer 112, there is little to medium displacement, that is, generally more displacement than in region 1226. The amount of displacement continues to increase moving away from the intersection of the x and z axes into regions 1230, 1232 and 1234 with maximum displacement occurring in regions 1236 at the corners of the cross-section. The displacement of the transduction layer 102 is such that the illustrated 2D mode has a symmetrical shape with respect to the z axis and with respect to the x axis. As compared with the example of FIG. 10 in which the ratio $w_2/W$ was 40%, there is a different displacement profile and, consequently, a different electromechanical coupling $k_t^2$.

Figure 13A:
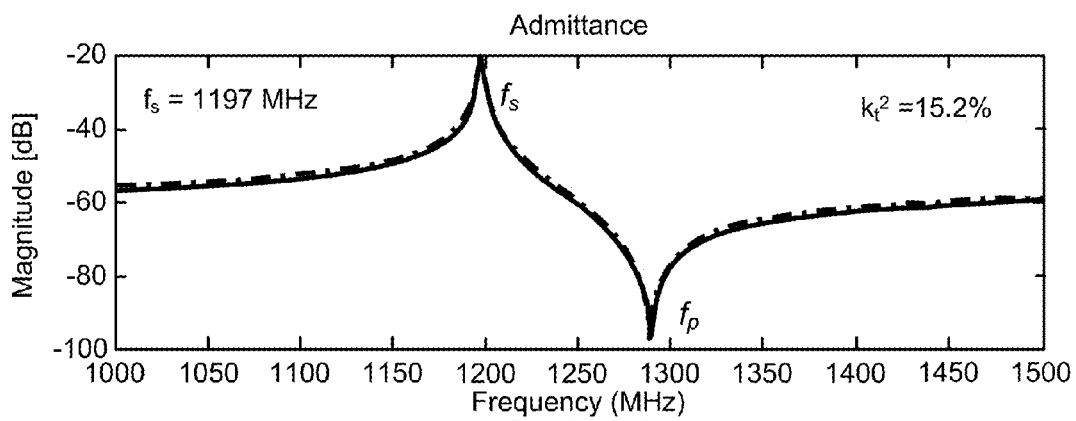
FIGS. 13A and 13B show plots depicting the magnitude and phase of the admittance, respectively, in relation to the frequency of an input AC signal provided to the example XDMR structure of FIG. 12.
Figure 13B:
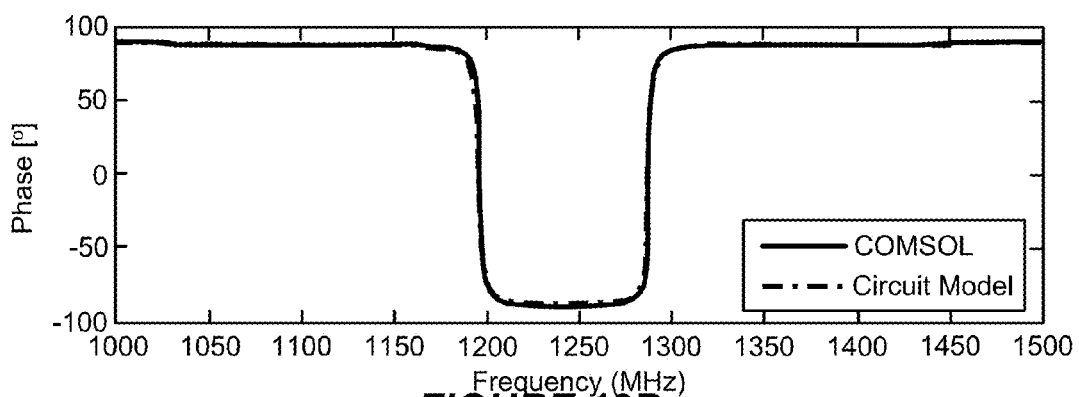

FIGS. 13A and 13B show plots depicting the magnitude and phase of the admittance, respectively, in relation to the frequency of an input AC signal provided to the example XDMR structure of FIG. 12. In FIG. 13A, the resonant frequency of the structure occurs between frequencies $f_s$, 1197 MHz in this example, and $f_p$. As illustrated in FIG. 13A, $f_s$ is the series resonant frequency and $f_p$ is the parallel resonant frequency. The electromechanical coupling $k_t^2$ is approximately 15.2%. As compared with the example of FIG. 10 in which the ratio $w_2/W$ was 40%, there is a decrease in the series resonant frequency $f_s$ while there is an increase in the electromechanical coupling $k_t^2$.

Figure 14:
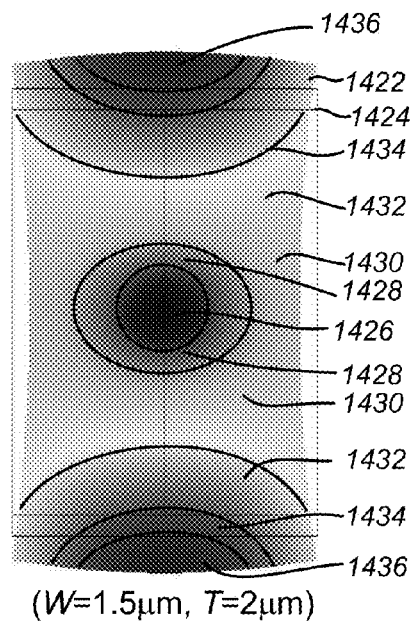
FIG. 14 shows an example of a geometric vibrational mode shape in a cross-section of a traditional piezoelectric layer.

FIG. 14 shows an example of a geometric vibrational mode shape 1422 in a cross-section of a traditional piezoelectric layer. For purposes of illustrating the dilation mode shape 1422, in FIG. 14, the rectangular shape 1424 indicates the cross-sectional shape of the piezoelectric layer before excitation and deformation. In FIG. 14, the z axis bisects the piezoelectric layer along its width, and the x axis bisects the piezoelectric layer along its thickness. In this example, the illustrated dilation mode shape 1422 is achieved with a single unitary piezoelectric layer formed of ZnO. However, although the example of FIG. 14 is also an example of a single unitary piezoelectric layer like the example of FIG. 6, unlike the example of FIG. 6 (formed entirely of AlN) in which the dilation mode shape was primarily 1D, the 2D dilation mode shape 1422 includes displacement along the z axis and along the x axis. In the example of FIG. 14, the width W is again 1.5 μm and the thickness T is again 2 μm.

As with the examples shown in other figures, the displacement within the transduction layer 102 varies depending on the location within the cross-section. For instance, in a first region 1426 of the cross-section of the transduction layer 102, including the intersection of the x and z axes, there is little or zero displacement. In a second region 1428 of the piezoelectric layer 112, there is little to medium displacement, that is, generally more displacement than in region 1426. The amount of displacement continues to increase moving away from the intersection of the x and z axes into regions 1430, 1432 and 1434 with maximum displacement occurring along the z axis in regions 1436 at the top and bottom surfaces of the cross-section. The displacement of the transduction layer 102 is such that the illustrated 2D mode has a symmetrical shape with respect to the z axis and with respect to the x axis.

Figure 15A:
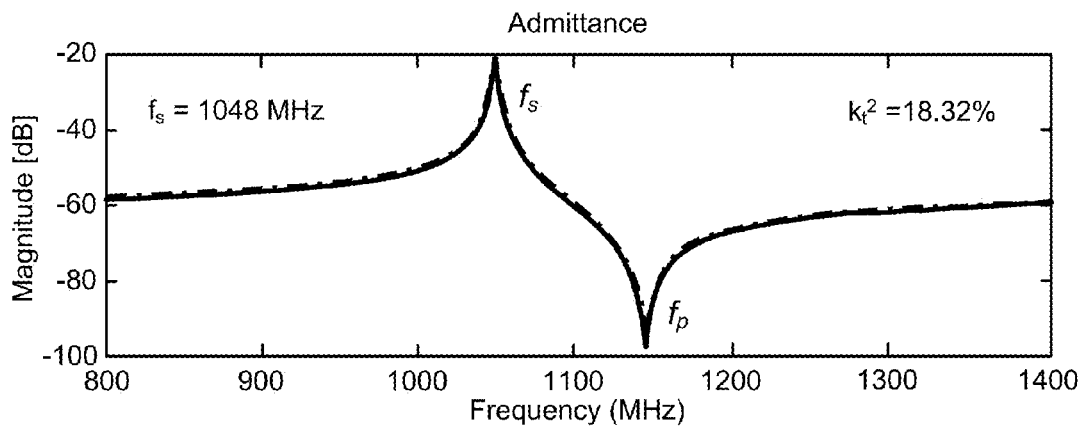
FIGS. 15A and 15B show plots depicting the magnitude and phase of the admittance, respectively, in relation to the frequency of an input AC signal provided to the example XDMR structure of FIG. 14.
Figure 15B:
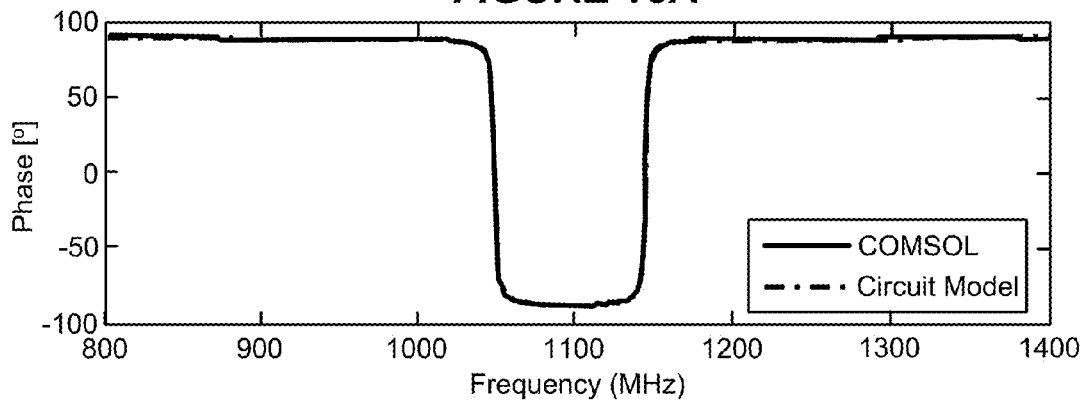

FIGS. 15A and 15B show plots depicting the magnitude and phase of the admittance, respectively, in relation to the frequency of an input AC signal provided to the example XDMR structure of FIG. 14. In FIG. 15A, the resonant frequency of the structure occurs between frequencies $f_s$, 1048 MHz in this example, and $f_p$. As illustrated in FIG. 15A, $f_s$ is the series resonant frequency and $f_p$ is the parallel resonant frequency. The electromechanical coupling $k_t^2$ is approximately 18.32%. As compared with the example of FIG. 120 in which the ratio $w_2/W$ was 20%, there is a decrease in the series resonant frequency $f_s$ while there is an increase in the electromechanical coupling $k_t^2$.

Thus, generally, as the proportion of ZnO increases and the proportion of AlN decreases, the shape of the vibrational modes changes, the resonant frequency decreases and the electromechanical coupling $k_t^2$ increases. Some other implementations using other materials or arrangements can generally be said to enable the tuning of resonant frequencies or other acoustic or electromechanical properties while not sacrificing—and in fact possible increasing—the electromechanical coupling $k_t^2$. In some other implementations, similar techniques can be used to achieve low electromechanical coupling $k_t^2$ and high Quality (Q) factor resonators for use in, for example, narrow-band filter applications. In such implementations, the key advantage is to engineer the effective $k_t^2$ and Q of the composite material.

While the described implementations have thus far focused on DMRs, and particularly XDMRs, the use of a composite transduction layer having multiple constituent layers is applicable to other types of acoustic wave devices. For example, many implementations are well-suited for any type of "thickness-mode" device; that is, a device in which at least one characteristic dimension determining the resonant modes and frequencies of the device is the thickness of the device, or more specifically, the thickness of the transduction layer. For example, other thickness-mode devices include FBARs, which traditionally have vibration only along the z-direction as a result of the $d_{33}$ coefficient. In some implementations, the described techniques and structures can be used to selectively prescribe the resonant frequencies of any thickness-mode device. In some implementations, the described techniques and structures can be used to selectively prescribe the mode shapes and the resonant frequencies of any thickness-mode device by changing the modes of vibration along any of the x-, y-, or z-directions by selectively configuring the effective stiffness coefficients, the effective piezoelectric coefficients, and the effective mass density of the transduction layer in the resonator structure. The described techniques and structure also may be practiced with CMRs or other non-thickness-mode devices. With CMRs the characteristic dimension is generally the lateral width or the pitch of the electrodes.

Additionally, while some implementations, such as those described above, include a transduction layer composed of three constituent piezoelectric layers 116, 118, and 120, in some other implementations more than three piezoelectric layers can be utilized. For example, the transduction layer 102 shown in FIG. 1 can be described as "ABA," where "A" indicates that the layers 116 and 120 are formed of material "A" (such as ZnO) and "B" indicates that the layer 118 is formed of material "B" (such as AlN). In some other implementations, the pattern of the constituent layers in the transduction layer can be (moving from left to right along the width and x axis) BAB, ABABA, BABAB, ABABABA, and BABABAB, among other suitable numbers, arrangements or patterns of layers. In some other implementations, the transduction layer can include a third piezoelectric or other material, a fourth piezoelectric or other material, a fifth piezoelectric or other material, and potentially still more piezoelectric as well as other material layers. For example, the pattern of the constituent layers in the transduction layer can be ABCBA, BCACB, CBABC, or ABCDCBABCDCBA, among other possibilities, where C represents a third material that may or may not be piezoelectric depending on the desired characteristics to be achieved. In each case, the combination of the elastic coefficients, the piezoelectric coefficients, and mass densities of the materials forming the constituent layers as well as the width and even arrangement of such layers determines the "effective" stiffness coefficients, the effective piezoelectric coefficients, and the effective mass density of the entire transduction layer. Additionally, in some implementations, other material properties of other non-piezoelectric layers also can be utilized to effect a change in the effective stiffness coefficients or other effective material properties of the transduction layer. Additionally, in some implementations, one or more of the constituent transduction layers are formed from other piezoelectric materials, such as lead zirconate titanate ($Pb[Zr_xTi_{1-x}]O_3$, where $0 \le x \le 1$) or "PZT," or non-piezoelectric materials such as, for example, silicon (Si), metals, and polymers. In some other implementations, gaps, spacings, or other geometric voids or patterns can be introduced or arranged within or between one or more of the piezoelectric or other constituent layers of the transduction layer. Additionally, it can generally be desirable in various implementations to have symmetry along each dimension (such as ABABA as opposed to BAABA). It also can be desirable that the sidewalls of the constituent layers are vertical so as to achieve a symmetric mode shape and maximum electromechanical coupling $k_t^2$.

Figure 16:
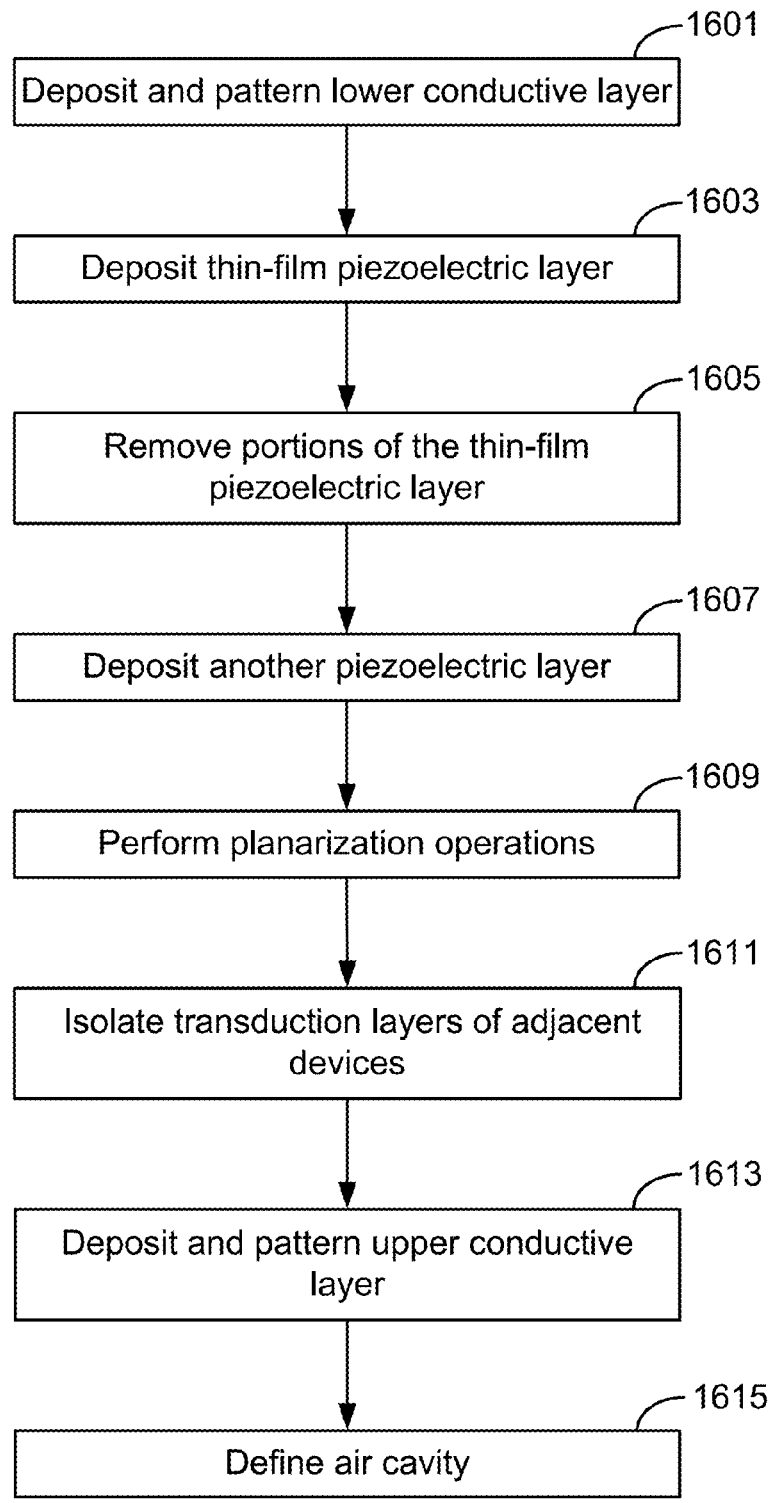
FIG. 16 shows an example of a flow diagram illustrating a process for forming an array of acoustic wave devices.
Figure 17A:
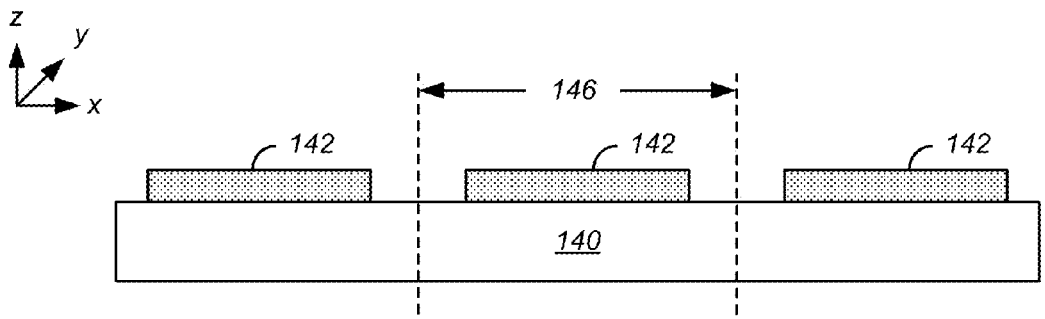
FIGS. 17A-17G show cross-sectional schematic depictions of example stages in a process as, for example, described with reference to FIG. 16.

FIG. 16 shows an example of a flow diagram illustrating a process for forming an array of acoustic wave devices. FIGS. 17A-17G show cross-sectional schematic depictions of example stages in a process as, for example, described with reference to FIG. 16. In some implementations, the process 1600 begins in block 1601 with depositing and patterning a lower conductive layer 106 over a substrate 140 to form a plurality of sets of lower electrodes 142, as FIG. 17A shows. In some implementations, the substrate 140 can be formed of a dielectric or semiconducting material. For example, the disclosed resonator structures can be fabricated on a low-cost, high-performance, large-area insulating substrate, which, in some implementations, forms at least a portion of the supporting structure described herein. In some implementations, the insulating substrate on which the disclosed resonator structures are formed can be made of display grade glass (alkaline earth boro-aluminosilicate) or soda lime glass. Other suitable insulating materials of which the insulating substrate can be made include silicate glasses, such as alkaline earth aluminosilicate, borosilicate, modified borosilicate, and others. Also, ceramic materials such as aluminum oxide (AlOx), yttrium oxide ($Y_2O_3$), boron nitride (BN), silicon carbide (SiC), aluminum nitride (AlNx), and gallium nitride (GaNx) can be used as the insulating substrate material. In some other implementations, the insulating substrate is formed of high-resistivity silicon. In some implementations, silicon On Insulator (SOI) substrates, gallium arsenide (GaAs) substrates, indium phosphide (InP) substrates, and plastic (polyethylene naphthalate or polyethylene terephthalate) substrates, e.g., associated with flexible electronics, also can be used. The substrate can be in conventional Integrated Circuit (IC) wafer form, e.g., 4-inch, 6-inch, 8-inch, 12-inch, or in large-area panel form. For example, flat panel display substrates with dimensions such as 370 mm×470 mm, 920 mm×730 mm, and 2850 mm×3050 mm, can be used.

The lower conductive layer 106 (as well as the upper conductive layer 104 deposited later in the process) may be made of various conductive metals, alloys, and other materials including platinum (Pt), aluminum (Al), molybdenum (Mo), tungsten (W), titanium (Ti), niobium (Nb), ruthenium (Ru), chromium (Cr), doped polycrystalline silicon, doped aluminum gallium arsenide (AlGaAs) compounds, gold (Au), copper (Cu), silver (Ag), tantalum (Ta), cobalt (Co), nickel (Ni), palladium (Pd), silicon germanium (SiGe), doped conductive zinc oxide (ZnO), and combinations thereof. In various implementations, the upper conductive layer 104 and the lower conductive layer 106 can include the same conductive material(s) or different conductive materials. In some implementations, one or more first layers are deposited before the lower conductive layer. For example, one or more seed layers (e.g., AlN) can be deposited prior to depositing the lower conductive layer 106 or the upper conductive layer 104 described below. In some implementations, the lower conductive layer 106 and the upper conductive layer 104 can be deposited by any suitable technique including, for example, sputtering.

Additionally, while only three device regions 146 are shown in FIGS. 17A-17G, in other implementations, the substrate 140 can include arrays of tens, hundreds, thousands, or more, of the device regions 140 enabling the production of as many XDMRs 100 or other acoustic wave devices on the substrate 140. Additionally, each device 146 can include one or more electrodes 142.

Figure 17B:
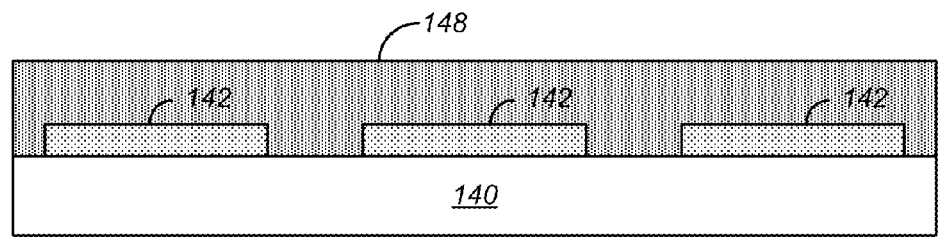

In some implementations, the process 1600 proceeds in block 1603 with depositing a thin-film piezoelectric layer 148 over the lower conductive layer 106, as FIG. 17B shows. The piezoelectric layer 148 is formed of a first piezoelectric material and includes a plurality of regions that each correspond in footprint with a corresponding device region 146. The piezoelectric materials that can be used to form the piezoelectric layer 148 include, for example, AlN, ZnO, gallium arsenide (GaAs), aluminum gallium arsenide (AlGaAs), gallium nitride (GaN), quartz, zinc-sulfide (ZnS), cadmium-sulfide (CdS), lithium tantalite (LiTaO3), lithium niobate (LiNbO3), PZT, members of the lead lanthanum zirconate titanate (PLZT) family, doped aluminum nitride, and combinations thereof. In some other implementations, the layer 148 can be formed of Si or another dielectric or semiconductor material. In some implementations, the piezoelectric layer 148 can be deposited with any of one or more suitable physical vapor deposition techniques including sputtering. In some implementations, the thickness T can be in the range of, for example, approximately 0.1 μm to approximately 4 μm. In some other implementations, the piezoelectric layer 148 can have a smaller or larger thickness. For example, in some implementations in which the process 100 produces an acoustic resonator, the operating frequency range of the acoustic resonator is inversely proportional to the thickness of the piezoelectric layer 148.

Figure 17C:
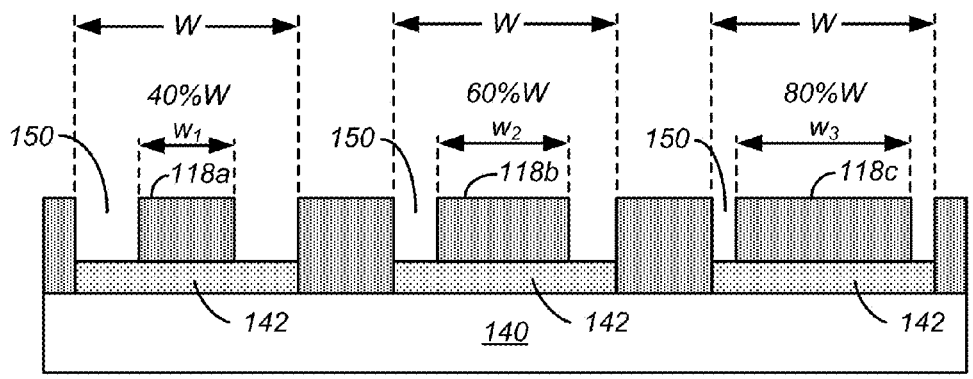

In some implementations, the process 1600 proceeds in block 1605 with using various lithographic (such as photographic) techniques including masking and etching, to remove portions of the thin-film piezoelectric layer 148 to produce a plurality of voids 150 and a plurality of piezoelectric portions 118a, 118b, and 118c, as FIG. 17C shows. In the implementation shown in FIG. 17C, the leftmost piezoelectric layer 118a has a width $w_2$ that is 40% of the total width W of the resultant transduction layer, the middle piezoelectric layer 118b has a width $w_2$ that is 60% of the total width W of the resultant transduction layer, and the rightmost piezoelectric layer 118c has a width $w_2$ that is 80% of the total width W of the resultant transduction layer. However, while the widths $w_2$ of the piezoelectric portions 118a, 118b, and 118c vary based on the desired acoustic or other electromechanical characteristics are desired, the thickness T of all of the piezoelectric portions is the same. Additionally, in this implementation, the width W of each resultant device is the same as the other devices.

Figure 17D:
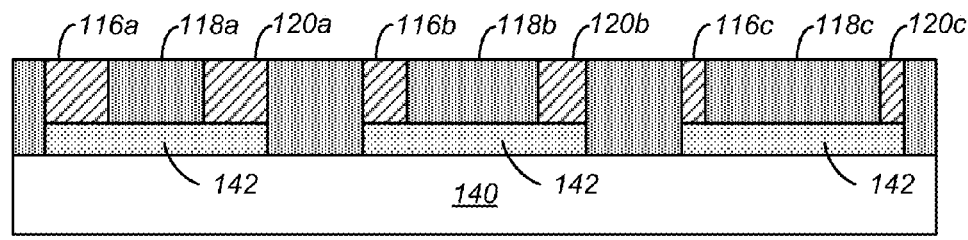

In some implementations, the process 1600 then proceeds in block 1607 with depositing another piezoelectric layer so as to produce the piezoelectric portions 116a, 116b, and 116c and the piezoelectric portions 120a, 120b, and 120c, as FIG. 17D shows. In some implementations, the piezoelectric portions 116a, 116b, and 116c and the piezoelectric portions 120a, 120b, and 120c are formed by sputtering a second piezoelectric or other material that is different from the first piezoelectric material. For example, as described above, when the first piezoelectric material is AN the second piezoelectric material can be ZnO. In some other implementations, PZT can be used to form the piezoelectric portions 116a, 116b, and 116c and the piezoelectric portions 120a, 120b, and 120c. In some such implementations, the PZT material can be applied in the sol gel, liquid, or paste form enabling ease of application by way of, for example, screen printing or other liquid or paste application techniques. In some such implementations using PZT, the PZT can be heated to crystallize the PZT after being applied in sol gel form.

In some implementations, the process 1600 then proceeds in block 1609 with performing one or more planarization operations. The planarization operations ensure that the upper surfaces of each of the piezoelectric portions 118a, 118b, and 118c are coplanar with the upper surfaces of each of the piezoelectric portions 116a, 116b, and 116c and coplanar with the upper surfaces of each of the piezoelectric portions 120a, 120b, and 120c. This can be desirable to, for example, produce a resonator structure with a symmetric mode shape and an increased electromechanical coupling $k_t^2$.

Figure 17E:
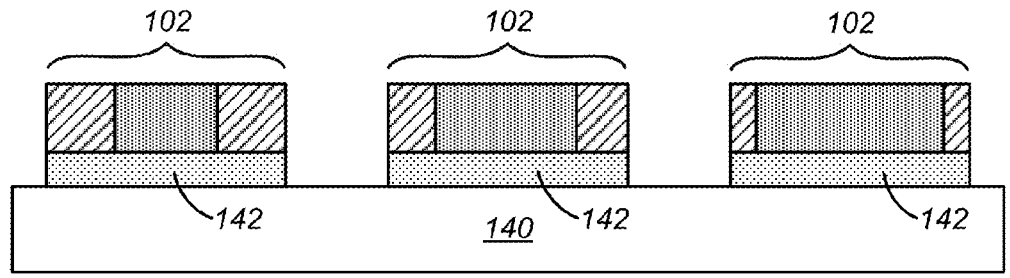

In some implementations, other portions of the piezoelectric layer 148 along the boundaries of the device regions 146 are removed in block 1611 to physically isolate the resultant transduction layers 102 from one another, as FIG. 17E shows. For example, reactive-ion etching may be used to separate the transduction layers 102. In some implementations, the spacing between adjacent result devices is in the range of approximately 10 to approximately 1000 μm. Although other spacings may be desired in other implementations.

Figure 17F:
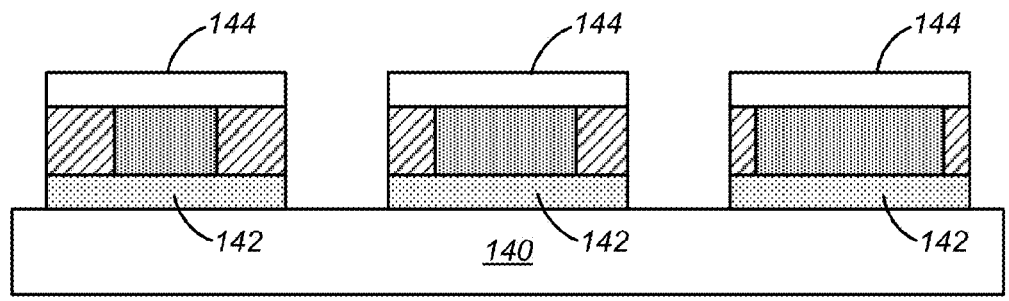

In some implementations, the process 1600 then proceeds in block 1613 with depositing and patterning an upper conductive layer over the transduction layers 102 to form a plurality of sets of upper electrodes 144, as FIG. 17F shows (in some other implementations, the upper conductive layer may be applied prior to isolating or separating the devices in block 1611). As with each set of lower electrodes 142, each set of upper electrodes 144 also can include one or more upper electrodes 144 formed of one or more of the materials described above for forming the lower electrodes 142. One or more other layers also can be deposited prior to or after the upper conductive layer.

Figure 17G:
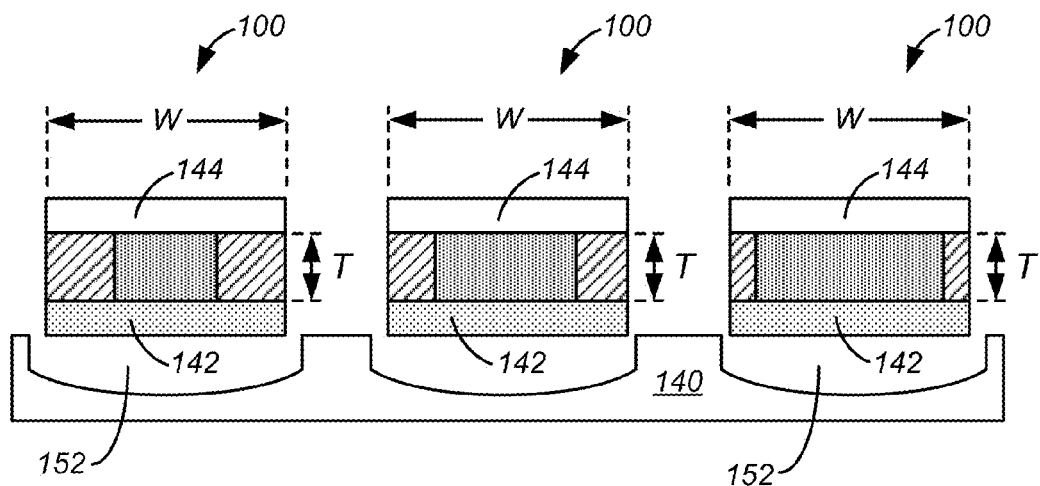

In some implementations, a portion of the substrate 140 below each transduction layer 102 is then removed in block 1615 to define an air gap or cavity 152 below each transduction layer 102 to acoustically isolate the transduction layer 102, as FIG. 17G shows. In some implementations, the cavity 152 can be etched or otherwise created by removing portions of the substrate 140 or portions of a sacrificial layer below each of the devices 100 to enable the devices 100 to vibrate freely in response to, for example, stimuli (e.g., electromagnetic, electrostatic, thermal, optical, magnetic, etc.). For example, a resultant acoustic wave device 100 can be stimulated by appropriate application of electric signals to ones of the lower or upper electrodes 142 and 144 resulting in the production of electric fields within the transduction layer 102 of the device 100. In this manner, an array of acoustic wave devices 100 (such as an array of XDMRs) can be produced at a batch-level on a single substrate with the same thickness yet having selectively-prescribed resonant or operating frequencies or other desired acoustic or electromechanical characteristics.

Figure 18A:
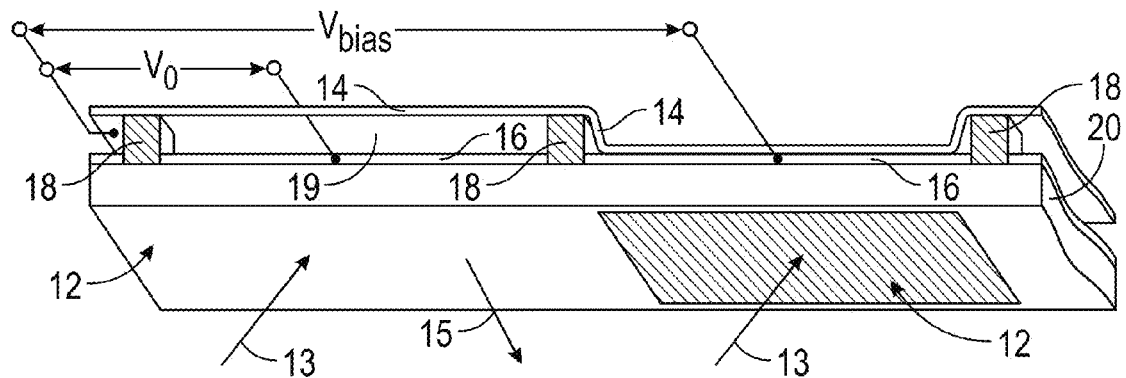
FIG. 18A shows an isometric view illustration depicting two adjacent interferometric modulator (IMOD) display elements in a series or array of display elements of an IMOD display device.

FIG. 18A shows an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 18A includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 18A, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 18A and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 18A, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 18A. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 18B:
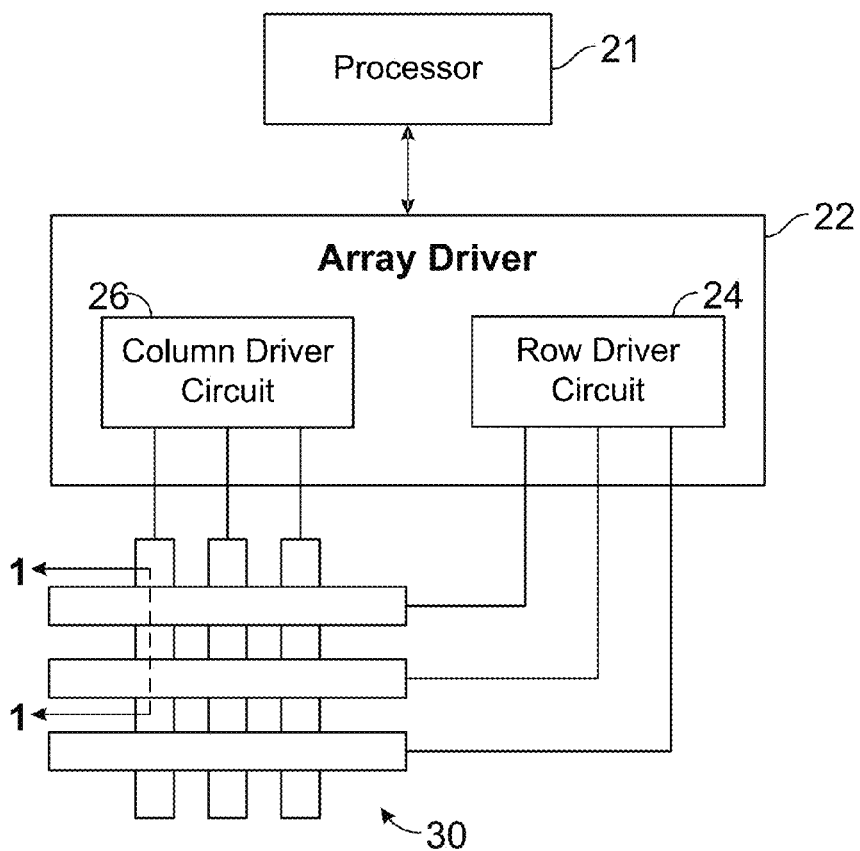
FIG. 18B shows a system block diagram illustrating an electronic device incorporating an IMOD-based display including a three element by three element array of IMOD display elements.

FIG. 18B shows a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 18A is shown by the lines 1-1 in FIG. 18B. Although FIG. 18B illustrates a 3×3 array of IMOD display elements for the sake of clarity, the display array 30 may contain a very large number of IMOD display elements, and may have a different number of IMOD display elements in rows than in columns, and vice versa.

Figure 19A:
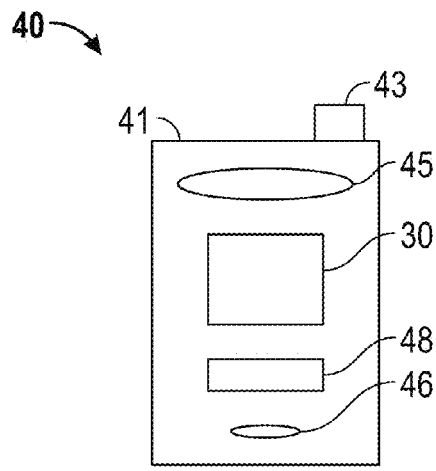
FIGS. 19A and 19B show system block diagrams illustrating a display device that includes a plurality of IMOD display elements.
Figure 19B:
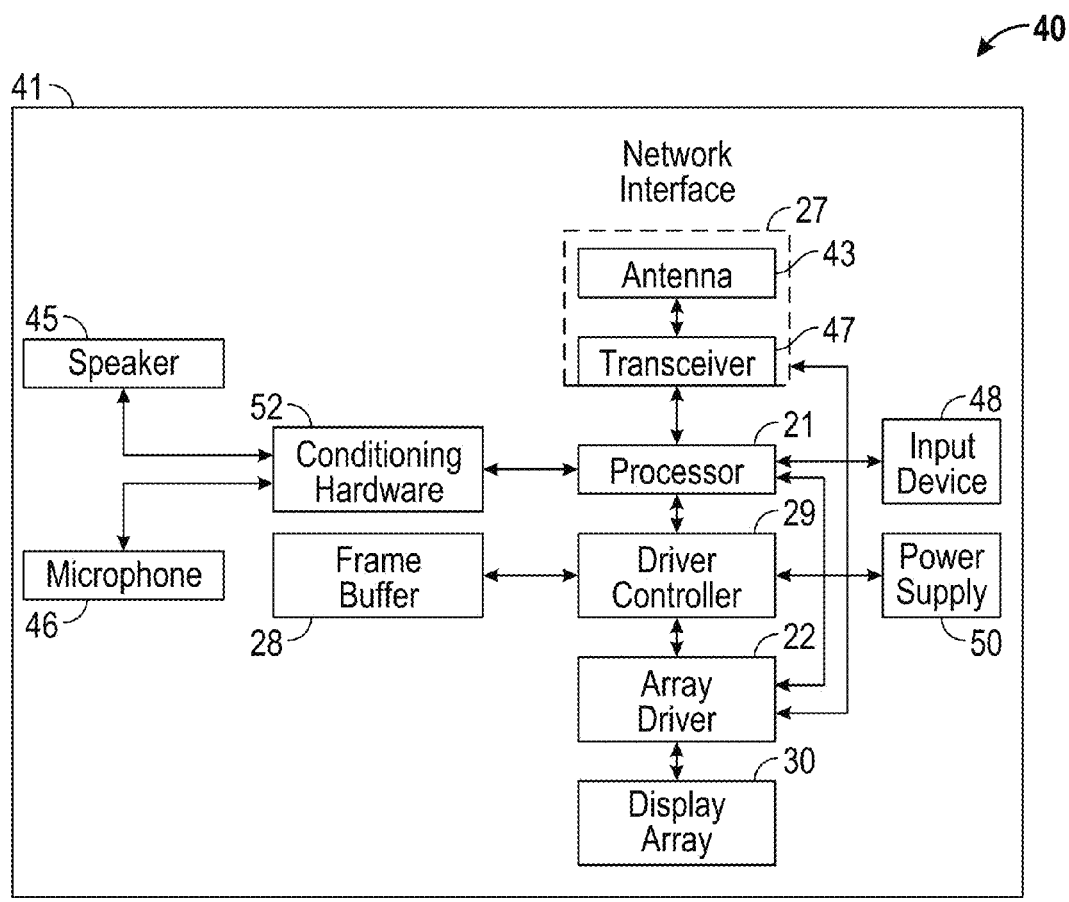

FIGS. 19A and 19B show system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 19A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 19A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A resonator structure comprising:
    a first conductive layer including one or more first electrodes;
    a second conductive layer including one or more second electrodes; and
    a transduction layer arranged between the first conductive layer and the second conductive layer, the transduction layer having a thickness along a z axis, a width along an x axis, and a length along a y axis, the transduction layer including:
        at least one first portion formed of a first piezoelectric material having a first set of piezoelectric coefficients and a first set of stiffness coefficients, the first portion having a first surface adjacent the first conductive layer and a second surface adjacent the second conductive layer opposite the first surface; and
        at least one second portion formed of a second piezoelectric material different than the first piezoelectric material and having a second set of piezoelectric coefficients and a second set of stiffness coefficients, the second portion having a first surface adjacent the first conductive layer and a second surface adjacent the second conductive layer opposite the first surface;
        each of the at least one first portion and the at least one second portion having substantially the same height along the z axis and substantially the same length along the y axis, the upper surfaces of each of the at least one first portion and the at least one second portion being substantially coplanar; and wherein the transduction layer is configured to, responsive to one or more signals provided to each of one or more of the first electrodes and the second electrodes, provide at least a first mode of vibration of the transduction layer.

2. The resonator structure of claim 1, wherein the transduction layer includes two or more first portions.

3. The resonator structure of claim 2, wherein the first and the second portions alternate periodically along the x axis.

4. The resonator structure of claim 2, wherein the transduction layer includes at least one third portion formed of a third material having a third set of stiffness coefficients.

5. The resonator structure of claim 2, wherein the transduction layer includes at least one gap or void between at least one first portion and at least one second portion.

6. The resonator structure of claim 1, wherein the first piezoelectric material is or includes zinc oxide (ZnO) and the second piezoelectric material is or includes aluminum nitride (AlN).

7. The resonator structure of claim 1, wherein the first piezoelectric material is or includes zinc oxide (ZnO) or aluminum nitride (AlN), and the second piezoelectric material is or includes lead zirconate titanate (PZT).

8. The resonator structure of claim 1, wherein a resonant frequency of the resonator structure is a function of at least the thickness of the transduction layer, the first set of stiffness coefficients, and the second set of stiffness coefficients.

9. The resonator structure of claim 1, wherein a resonant frequency of the resonator structure is a function of a mass density of at least one of the first piezoelectric material and the second piezoelectric material.

10. The resonator structure of claim 1, wherein a resonant frequency of the resonator structure is a function of at least one of the first set of piezoelectric coefficients and at least one of the second set of piezoelectric coefficients.

11. The resonator structure of claim 1, wherein a resonant frequency of the resonator structure is defined at least in part by the ratio of the combined width of all of the at least one second portions to the entire width of the transduction layer.

12. The resonator structure of claim 1, wherein an electromechanical coupling of the transduction layer is a function of at least one of the first set of piezoelectric coefficients and the second set of piezoelectric coefficients.

13. The resonator structure of claim 2, wherein the first and the second portions are arranged symmetrically relative to a mid-plane of the transduction layer along the y and z axes.

14. The resonator structure of claim 1, wherein the first mode of vibration includes a displacement component along the z axis and at least one displacement component along the plane of the x axis and the y axis.

15. A device comprising:
an array of resonator structures, the array of resonator structures including a plurality of sets of one or more resonator structures, each resonator structure including:
a first conductive layer including one or more first electrodes;
a second conductive layer including one or more second electrodes; and
a transduction layer arranged between the first conductive layer and the second conductive layer, the transduction layer having a thickness along a z axis, a width along an x axis, and a length along a y axis, the transduction layer including:
at least one first portion formed of a first piezoelectric material having a first set of piezoelectric coefficients and a first set of stiffness coefficients, the first portion having a first surface adjacent the first conductive layer and a second surface adjacent the second conductive layer opposite the first surface; and
at least one second portion formed of a second piezoelectric material different than the first piezoelectric material and having a second set of piezoelectric coefficients and a second set of stiffness coefficients, the second portion having a first surface adjacent the first conductive layer and a second surface adjacent the second conductive layer opposite the first surface;
each of the at least one first portion and the at least one second portion having substantially the same height along the z axis and substantially the same length along the y axis, the upper surface of each of the at least one first portion and the at least one second portion being substantially coplanar; and
wherein the transduction layer is configured to, responsive to one or more signals provided to each of one or more of the first electrodes and the second electrodes, provide at least a first mode of vibration of the transduction layer;
wherein a thickness of the transduction layer of each resonator structure is substantially equal to the thicknesses of the transduction layers in all the other resonator structures in the array of resonator structures; and
wherein a combination of the first and second piezoelectric coefficients and the first and second stiffness coefficients in the transduction layer of each resonator structure in each set of resonator structures is substantially the same combination as in the other resonator structures of the set and different than the combinations in the other resonator structures of all the other sets in the array of resonator structures.

16. The device of claim 15, wherein the transduction layer includes two or more first portions.

17. The device of claim 16, wherein the first and the second portions alternate periodically along the x axis.

18. The device of claim 16, wherein the transduction layer includes at least one third portion formed of a third material having a third set of stiffness coefficients.

19. The device of claim 16, wherein the transduction layer includes at least one gap or void between at least one first portion and at least one second portion.

20. The device of claim 15, wherein a resonant frequency of each resonator structure is a function of at least the thickness of the transduction layer of the resonator structure, the first set of stiffness coefficients of the resonator structure, and the second set of stiffness coefficients of the resonator structure.

21. The device of claim 15, wherein a resonant frequency of the resonator structure is a function of a mass density of at least one of the first piezoelectric material and the second piezoelectric material.

22. The device of claim 15, wherein a resonant frequency of the resonator structure is defined at least in part by the ratio of the combined width of all of the at least one second portions to the entire width of the transduction layer.

23. The device of claim 15, wherein an electromechanical coupling of the transduction layer is a function of at least one of the first set of piezoelectric coefficients and the second set of piezoelectric coefficients.

24. A device comprising:
first conductive means including one or more first electrodes;

second conductive means including one or more second electrodes; and transduction means arranged between the first conductive means and the second conductive means, the transduction means having a thickness along a z axis, a width along an x axis, and a length along a y axis, the transduction means including:

at least one first portion formed of a first piezoelectric material having a first set of piezoelectric coefficients and a first set of stiffness coefficients, the first portion having a first surface adjacent the first conductive means and a second surface adjacent the second conductive means opposite the first surface; and at least one second portion formed of a second piezoelectric material different than the first piezoelectric material and having a second set of piezoelectric coefficients and a second set of stiffness coefficients, the second portion having a first surface adjacent the first conductive means and a second surface adjacent the second conductive means opposite the first surface;

each of the at least one first portion and the at least one second portion having substantially the same height along the z axis and substantially the same length along the y axis, the upper surfaces of each of the at least one first portion and the at least one second portion being substantially coplanar; and wherein the transduction means includes means for, responsive to one or more signals provided to each of one or more of the first electrodes and the second electrodes, provide at least a first mode of vibration of the transduction means.

25. The device of claim 24, wherein the transduction layer includes two or more first portions.

26. The device of claim 25, wherein the first and the second portions alternate periodically along the x axis.

27. The device of claim 24, wherein a resonant frequency of the device is a function of at least the thickness of the transduction means, the first set of stiffness coefficients, and the second set of stiffness coefficients.

28. The device of claim 24, wherein a resonant frequency of the resonator structure is a function of a mass density of at least one of the first piezoelectric material and the second piezoelectric material.

29. The device of claim 24, wherein a resonant frequency of the resonator structure is defined at least in part by the ratio of the combined width of all of the at least one second portions to the entire width of the transduction means.

30. The device of claim 24, wherein an electromechanical coupling of the transduction means is a function of at least one of the first set of piezoelectric coefficients and the second set of piezoelectric coefficients.

\* \* \* \* \*